(12) United States Patent
Arikawa et al.

(10) Patent No.: US 12,538,748 B2
(45) Date of Patent: Jan. 27, 2026

(54) CERAMIC JOINED BODY, ELECTROSTATIC CHUCKING DEVICE, AND METHOD FOR PRODUCING CERAMIC JOINED BODY

(71) Applicant: SUMITOMO OSAKA CEMENT CO., LTD., Tokyo (JP)

(72) Inventors: Jun Arikawa, Tokyo (JP); Nobuhiro Hidaka, Tokyo (JP); Yukio Miura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 273 days.

(21) Appl. No.: 18/029,821

(22) PCT Filed: Aug. 31, 2021

(86) PCT No.: PCT/JP2021/031940
§ 371 (c)(1),
(2) Date: Mar. 31, 2023

(87) PCT Pub. No.: WO2022/085307
PCT Pub. Date: Apr. 28, 2022

(65) Prior Publication Data
US 2023/0386880 A1 Nov. 30, 2023

(30) Foreign Application Priority Data
Oct. 21, 2020 (JP) ............................... 2020-176425

(51) Int. Cl.
*H01L 21/683* (2006.01)
*C04B 37/00* (2006.01)
(Continued)

(52) U.S. Cl.
CPC ........ *H01L 21/6833* (2013.01); *C04B 37/003* (2013.01); *H01J 37/32715* (2013.01);
(Continued)

(58) Field of Classification Search
CPC ........... H01L 21/6833; H01J 37/32715; C04B 37/003
(Continued)

(56) References Cited

U.S. PATENT DOCUMENTS 7,580,238 B2 * 8/2009 Kim ...................... H01L 21/683
361/231
8,834,674 B2 * 9/2014 Motokawa ................ G03F 1/80
156/345.47
(Continued)

FOREIGN PATENT DOCUMENTS

JP 2004-103648 A 4/2004
JP 2005-057214 A 3/2005
(Continued)

OTHER PUBLICATIONS

PE2E Translation of JP2016 201411 by Iwashita, Akira.*
(Continued)

*Primary Examiner* — Thienvu V Tran
*Assistant Examiner* — Lucy M Thomas
(74) *Attorney, Agent, or Firm* — Merchant & Gould P.C.

(57) ABSTRACT

A ceramic joined body includes: a pair of ceramic plates; and an electrode layer that is interposed between the pair of ceramic plates, in which the electrode layer is embedded in at least one of the pair of ceramic plates, and in an outer edge of the electrode layer, a joint surface between the at least one of the pair of ceramic plates and the electrode layer has an inclination with respect to a thickness direction of the pair of ceramic plates and the electrode layer.

16 Claims, 9 Drawing Sheets

(51) Int. Cl.
  *H01J 37/32* (2006.01)
  *H01T 23/00* (2006.01)
(52) U.S. Cl.
  CPC .. *C04B 2237/064* (2013.01); *C04B 2237/083* (2013.01); *C04B 2237/343* (2013.01); *C04B 2237/64* (2013.01); *C04B 2237/68* (2013.01); *H01J 2237/2007* (2013.01)
(58) Field of Classification Search
  USPC ........................................................ 361/234
  See application file for complete search history.
(56) References Cited

U.S. PATENT DOCUMENTS

| | | |
|---|---|---|
| 2007/0212567 A1 | 9/2007 | Esaki et al. |
| 2020/0035538 A1* | 1/2020 | Momiyama ............. B23Q 3/15 |
| 2020/0227300 A1* | 7/2020 | Lee .................... H01L 21/6875 |
| 2021/0074571 A1* | 3/2021 | Momiyama ....... H01L 21/68735 |

FOREIGN PATENT DOCUMENTS

| | | |
|---|---|---|
| JP | 2005-159334 A | 6/2005 |
| JP | 2011-148687 A | 8/2011 |
| JP | 5841329 B | 1/2016 |
| JP | 2016-201411 A | 12/2016 |
| JP | 2017-178663 A | 10/2017 |
| JP | 2020-025072 A | 2/2020 |

OTHER PUBLICATIONS

Office Action for Japanese Patent Application No. 2022-557253 (Jun. 13, 2023).

International Search Report for PCT/JP2021/031940 (Nov. 16, 2021).

* cited by examiner

CERAMIC JOINED BODY, ELECTROSTATIC CHUCKING DEVICE, AND METHOD FOR PRODUCING CERAMIC JOINED BODY

This application is a National Stage Application of PCT/JP2021/031940, filed on Aug. 31, 2021, which claims benefit of priority to Japanese Patent Application No. 2020-176425, the content of which is incorporated herein by reference. To the extent appropriate, a claim of priority is made to each of the above disclosed applications.

TECHNICAL FIELD

The present invention relates to a ceramic joined body, an electrostatic chucking device, and a method for producing a ceramic joined body.

This application claims priority based on Japanese Patent Application No. 2020-176425 filed on Oct. 21, 2020, the content of which is incorporated herein by reference.

BACKGROUND ART

In the related art, in a semiconductor production step of producing a semiconductor device such as IC, LSI, or VLSI, a plate-shaped sample such as a silicon wafer is fixed to an electrostatic chuck member having an electrostatic chuck function by electrostatic adsorption, and a predetermined process is performed thereon.

For example, when the plate-shaped sample is etched in a plasma atmosphere, a surface of the plate-shaped sample is heated to a high temperature by heat of the plasma, and there is a problem in that, for example, a resist film of the surface is burst.

Here, in order to maintain the temperature of the plate-shaped sample at a desired given temperature, an electrostatic chucking device having a cooling function is used. The electrostatic chucking device includes the above-described electrostatic chuck member and a base member for adjusting a temperature where a flow path that circulates a coolant for controlling a temperature to the inside of a metal member is formed. The electrostatic chuck member and the base member for adjusting a temperature are joined and integrated through a silicone adhesive on a lower surface of the electrostatic chuck member.

In this electrostatic chucking device, the coolant for adjusting a temperature is circulated for heat exchange to the flow path of the base member for adjusting a temperature such that electrostatic adsorption can be performed while maintaining the temperature of the plate-shaped sample fixed to an upper surface of the electrostatic chuck member to a desired temperature. Therefore, by using the above-described electrostatic chucking device, various plasma treatments can be performed on the plate-shaped sample while maintaining the temperature of the plate-shaped sample to be electrostatically adsorbed.

As the electrostatic chuck member, a configuration including a ceramic joined body that includes a pair of ceramic plates and an electrode layer interposed between the pair of ceramic plates is known. As a method for producing the ceramic joined body, for example, there is known a method including: forming a groove in one ceramic sintered compact; forming a conductive layer in the groove; grinding and mirror-polishing the conductive layer together with the ceramic sintered compact; and joining the one ceramic sintered compact to another ceramic sintered compact by hot press (for example refer to Patent Literature No. 1).

CITATION LIST

Patent Literature

[Patent Literature No. 1] Japanese Patent No. 5841329

SUMMARY OF INVENTION

Technical Problem

Patent Literature No. 1 indicates that fine spaces (voids) remain in an interface (joint interface) where the pair of ceramic plates are bonded, and a withstand voltage of the electrostatic chuck member may decrease, that is, breakdown may occur due to this mechanism. In the electrostatic chuck member including the voids, when a high voltage is applied to a dielectric layer (ceramic plate), it is expected that charges accumulate in the voids and are discharged such that breakdown occurs in the ceramic plate.

However, in the method described in Patent Literature No. 1, the formation of voids between the electrode layer and the ceramic plate cannot be sufficiently suppressed.

The present invention has been made in consideration of the above-described circumstances, and an object thereof is to provide a ceramic joined body where the occurrence of breakdown in a ceramic plate caused by discharge is suppressed when a high voltage is applied, an electrostatic chucking device including the ceramic joined body, and a method for producing the ceramic joined body.

Solution to Problem

In order to achieve the above-described object, the present invention includes the following aspects.

[1] A ceramic joined body includes:
a pair of ceramic plates; and
an electrode layer that is interposed between the pair of ceramic plates,
in which the electrode layer is embedded in at least one of the pair of ceramic plates, and
in an outer edge of the electrode layer, a joint surface between the at least one of the pair of ceramic plates and the electrode layer has an inclination with respect to a thickness direction of the pair of ceramic plates and the electrode layer.

[2] A ceramic joined body includes:
a pair of ceramic plates;
an electrode layer that is interposed between the pair of ceramic plates; and
an insulating layer that is disposed in a periphery of the electrode layer between the pair of ceramic plates,
in which in an outer edge of the electrode layer, a joint surface between the electrode layer and the insulating layer has an inclination with respect to a thickness direction of the pair of ceramic plates, the electrode layer, and the insulating layer.

[3] The ceramic joined body according to [1] or [2],
in which the electrode layer is formed of an insulating ceramic and a conductive ceramic.

[4] The ceramic joined body according to [3],
in which the insulating ceramic is at least one selected from the group consisting of $Al_2O_3$, AlN, $Si_3N_4$, $Y_2O_3$, YAG, $SmAlO_3$, MgO, and $SiO_2$.

[5] The ceramic joined body according to [3] or [4],
in which the conductive ceramic is at least one selected from the group consisting of SiC, $TiO_2$, TiN, TiC, W, WC, Mo, $Mo_2C$, and C.

[6] The ceramic joined body according to any one of [1] to [5],
in which a relative density of the outer edge of the electrode layer is lower than a relative density of a center of the electrode layer.

[7] The ceramic joined body according to any one of [1] to [6],
in which materials of the pair of ceramic plates are the same as each other.

[8] An electrostatic chucking device,
in which an electrostatic chuck member formed of a ceramic and a base member for adjusting a temperature formed of a metal are joined through an adhesive layer, and
the electrostatic chuck member is formed of the ceramic joined body according to any one of [1] to [7].

[9] A method for producing a ceramic joined body comprising:
a step of forming a recess portion on a surface of at least one of a pair of ceramic plates where the pair of ceramic plates overlap each other, the recess portion having an inclined surface that is inclined with respect to a thickness direction of the pair of ceramic plates;
a step of applying a paste for forming an electrode layer to the recess portion to form an electrode layer coating film;
a step of laminating the pair of ceramic plates in a posture in which the surface where the electrode layer coating film is formed faces inward; and
a step of pressurizing the laminate including the pair of ceramic plates and the electrode layer coating film in the thickness direction while heating the laminate.

[10] A method for producing a ceramic joined body comprising:
a step of applying a paste for forming an electrode layer to a surface of at least of a pair of ceramic plates where the pair of ceramic plates overlap each other to form an electrode layer coating film and applying a paste for forming an insulating layer to a periphery of the electrode layer coating film to form an insulating layer coating film;
a step of laminating the pair of ceramic plates in a posture in which the surface where the electrode layer coating film and the insulating layer coating film are formed faces inward; and
a step of pressurizing the laminate including the pair of ceramic plates, the electrode layer coating film, and the insulating layer coating film in a thickness direction while heating the laminate,
in which in the step of forming the insulating layer coating film, an outer edge of the electrode layer coating film and an inner edge of the insulating layer coating film overlap each other, and a contact surface between the electrode layer coating film and the insulating layer coating film has an inclination with respect to the thickness direction of the pair of ceramic plates.

Advantageous Effects of Invention

According to the present invention, it is possible to provide a ceramic joined body where the occurrence of breakdown in a ceramic plate caused by discharge is suppressed when a high voltage is applied, an electrostatic chucking device including the ceramic joined body, and a method for producing the ceramic joined body.

DESCRIPTION OF EMBODIMENTS

Embodiments of a ceramic joined body, an electrostatic chucking device, and a method for producing a ceramic joined body according to the present invention will be described.

The embodiments will be described in detail for easy understanding of the concept of the present invention, but the present invention is not limited thereto unless specified otherwise.

[Ceramic Joined Body]

First Embodiment

Figure 1:
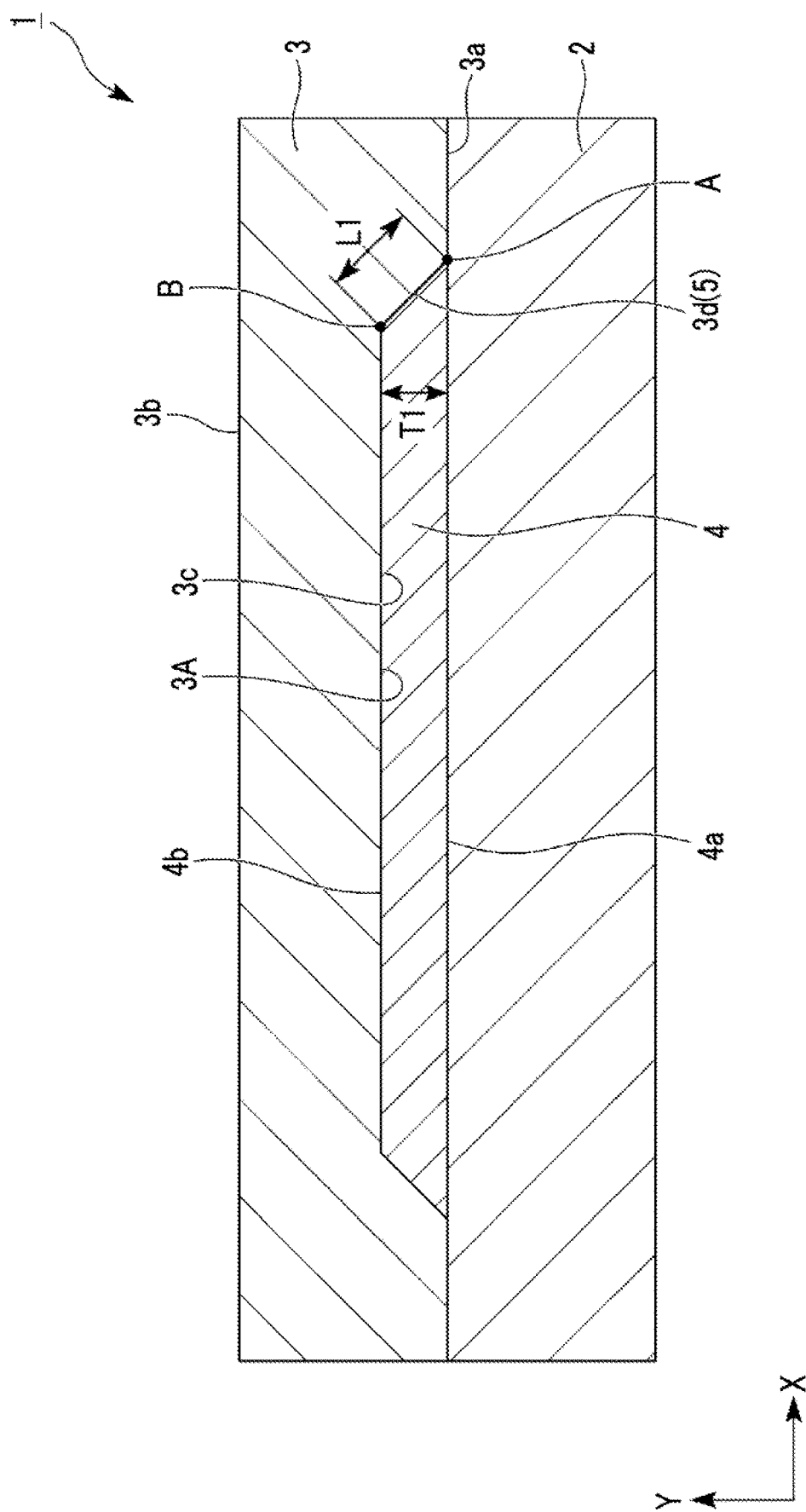
FIG. 1 is a cross-sectional view showing a ceramic joined body according to one embodiment of the present invention.

Hereinafter, a ceramic joined body according to one embodiment of the present invention will be described with reference to FIG. 1. In FIG. 1, note that a horizontal direction of the paper plane (width direction of the ceramic joined body) is an X direction and a vertical direction of the paper plane (thickness direction of the ceramic joined body) is a Y direction.

In all of the following drawings, dimensions, ratios, and the like of the components may be appropriately different from the actual ones in order to easily understand the drawings.

FIG. 1 is a cross-sectional view showing the ceramic joined body according to the embodiment. As shown in FIG. 1, the ceramic joined body 1 according to the embodiment includes: a pair of ceramic plates 2 and 3; and an electrode layer 4 that is interposed between the pair of ceramic plates 2 and 3.

In the ceramic joined body, a space may be formed an interface between the members or the inside of the electrode layer without the interface or the inside being solid. In the following description, the space formed in the ceramic joined body is called "void", "gap", or "pore" based on a position and a size where the space is to be formed.

The term "space" is a generic term for the void, the gap, the pore.

The term "void" refers to a space having a major axis length of less than 50 µm that is formed at an interface between a first ceramic plate and the electrode layer or at an interface between a second ceramic plate and the electrode layer.

The term "gap" refers to a space having a major axis length of 50 μm or more that is formed at the interface between the first ceramic plate and the electrode layer or at the interface between the second ceramic plate and the electrode layer.

The term "pore" refers to a space that is formed in the electrode layer.

The major axis length of each of the void and the gap corresponds to the length of a long side of a minimum rectangle circumscribing the space (the void or the gap).

When a minimum circle among circles circumscribing the ceramic joined body 1 in a plan view is assumed, the cross-sectional view shown in FIG. 1 is a cross-section of the ceramic joined body taken along a virtual plane including the center of the circle. When the ceramic joined body 1 is substantially circular in a plan view, the center of the circle and the center of the shape of the ceramic joined body in a plan view substantially match each other.

In the present specification, "plan view" refers to a view seen from the Y direction that is the thickness direction of the ceramic joined body.

In addition, in the present specification, "outer edge" refers to a region in the vicinity of an outer periphery of an object in a plan view.

Hereinafter, the ceramic plate 2 will be referred to as the first ceramic plate 2, and the ceramic plate 3 will be referred to as the second ceramic plate 3.

As shown in FIG. 1, in the ceramic joined body 1, the first ceramic plate 2, the electrode layer 4, and the second ceramic plate 3 are laminated in this order. That is, the ceramic joined body 1 is a joined body where the first ceramic plate 2 and the second ceramic plate 3 are joined and integrated through the electrode layer 4.

In the ceramic joined body 1, an outer edge of the electrode layer 4 overlaps a joint surface 5 in a plan view and is not exposed to the outside of the ceramic joined body 1. In addition, in the outer edge of the electrode layer 4, the joint surface 5 between the second ceramic plate 3 and the electrode layer 4 has an inclination with respect to the thickness direction (the Y direction in FIG. 1) of the pair of ceramic plates 2 and 3 and the electrode layer 4. As a result, when surfaces 4a and 4b of the electrode layer 4 facing each other in the Y direction are compared, the surface 4a on the −Y side in contact with the first ceramic plate 2 is wider than the surface 4b on the +Y side in contact with the second ceramic plate 3.

In the second ceramic plate 3, a recess portion 3A that is recessed in the +Y direction (in the thickness direction of the second ceramic plate 3) from a joint surface 3a with the first ceramic plate 2 toward a surface 3b side opposite to the joint surface 3a is formed. An opening diameter of the recess portion 3A decreases in the +Y direction. The recess portion 3A includes: a bottom surface 3c parallel to the surface 3b of the second ceramic plate 3; and an inclined surface 3d that is inclined obliquely with respect to the thickness direction of the second ceramic plate 3. The inclined surface 3d of the recess portion 3A is a surface that is inclined from the bottom surface 3c toward the joint surface 3a side.

The electrode layer 4 is formed of an electrode layer coating film that is formed by applying (filling) a paste for forming an electrode layer to the recess portion 3A. Accordingly, the joint surface 5 between the second ceramic plate 3 and the electrode layer 4 is the same as the inclined surface 3d of the recess portion 3A. The electrode layer 4 is embedded in the recess portion 3A of the second ceramic plate 3.

The outer edge of the electrode layer 4 has an inclination complementary to the inclined surface 3d of the second ceramic plate 3, and has an inclination complementary to the joint surface 3a.

As shown in FIG. 1, it is preferable that a length L1 of the joint surface 5 (slope) between the second ceramic plate 3 and the electrode layer 4 is more than a thickness T1 of the electrode layer 4. As a result, the formation of voids between the second ceramic plate 3 and the electrode layer 4 can be suppressed, and the second ceramic plate 3 and the electrode layer 4 can sufficiently adhere to each other. Thus, when a high voltage is applied to the ceramic joined body 1, discharge in a joint interface between the second ceramic plate 3 and the electrode layer 4 can be suppressed. As a result, the breakdown of the ceramic joined body 1 caused by discharge can be suppressed.

The electrode layer 4 is a thin electrode that is wider in a direction perpendicular to the thickness direction than in the thickness direction. For example, the electrode layer 4 has a disk shape having a thickness of 20 μm and a diameter of 29 cm. As described below, the electrode layer 4 can be formed by applying and sintering the paste for forming an electrode layer. The paste for forming an electrode layer is likely to isotropically shrink by sintering during volume shrinkage. Therefore, the shrinkage amount in the direction perpendicular to the thickness direction is more than that in the thickness direction. Therefore, voids are likely to be structurally formed in the outer edge of the electrode layer 4, that is, the interface between the electrode layer 4 and the second ceramic plate 3.

A ratio (L1/T1) of the length L1 of the joint surface 5 to the thickness T1 of the electrode layer 4 is preferably 1.7 or more and 6.5 or less, more preferably 2.0 or more and 5.0 or less, and still more preferably 2.2 or more and 4.5 or less. L1>T1 is satisfied.

The length L1 is the length from a contact position A between the surface 4a and the joint surface 5 to a contact position B between the surface 4b and the joint surface 5 in the cross-section of the ceramic joined body 1. When tangent lines of the surfaces 4a and 4b are drawn in the cross-section, the position A and the position B can be determined to be intersection positions between the tangent lines and the joint surface 5, respectively. Even in other embodiments described below, opposite positions of the joint surface on which the length of the joint surface is based are determined using the same method.

When the ratio (L1/T1) is in the above-described range, the formation of voids between the second ceramic plate 3 and the electrode layer 4 can be suppressed, and the second ceramic plate 3 and the electrode layer 4 can sufficiently adhere to each other. Thus, when a high voltage is applied to the ceramic joined body 1, charges are not likely to accumulate in the joint interface between the second ceramic plate 3 and the electrode layer 4. As a result, discharge caused by an electric field accumulated in the joint interface can be suppressed, and the breakdown of the ceramic joined body 1 caused by discharge can be suppressed.

When the ratio (L1/T1) is less than the lower limit value, the inclination of the joint surface 5 (inclined surface 3d) with respect to the Y direction during joining is reduced. Therefore, the adhesiveness between the second ceramic plate 3 and the electrode layer 4 deteriorates.

When the ratio (L1/T1) exceeds the upper limit value, the inclination of the joint surface 5 with respect to the Y direction increases, and the area of a portion (for example, a portion having a thickness less than ½ T1) that is thinner than the center of the electrode layer 4 in the outer edge of the electrode layer 4 increases to be more than that the ceramic joined body where L1/T1 is the upper limit value or less. In the ceramic joined body, when power is applied to the electrode layer 4, the amount of heat generated in the outer edge of the electrode layer 4 is more than the amount of heat generated at the center of the electrode layer 4, and the temperature in the outer edge of the electrode layer 4 is likely to be high. Therefore, in the ceramic joined body where L1/T1 exceeds the upper limit value, in-plane temperature uniformity during application of high frequency power deteriorates.

In the embodiment, "junction ratio of the joint surface 5 between the ceramic plate 3 and the electrode layer 4" can be calculated from any scanning electron microscope image of the joint surface 5.

That is, in a freely selected field of view (cross-section that is freely prepared in the ceramic joined body 1), an electron microscope image at a magnification of 1000-fold is obtained, and the length of an inclined surface in the electron microscope image is set as "total length (L1) of the joint surface 5".

On the other hand, in the electron microscope image, a major axis length of each of voids formed between the ceramic plate 3 and the electrode layer 4 is obtained, and the sum of the major axis lengths is set as "void length (D1) in the joint surface 5".

Based on the lengths obtained as described above, a ratio of "the total length (L1) of the joint surface 5" to "the void length (D1) in the joint surface 5" is obtained in percentage, and the obtained value is subtracted from 100% to calculate a value as "the junction ratio of the joint surface 5 between the ceramic plate 3 and the electrode layer 4".

The junction ratio of the joint surface 5 between the ceramic plate 3 and the electrode layer 4 is preferably 25% or more, more preferably 40% or more, still more preferably 50% or more, and still more preferably 60% or more.

In a case where the junction ratio of the joint surface 5 between the ceramic plate 3 and the electrode layer 4 is the lower limit value or more, when a high voltage is applied to the ceramic joined body 1, discharge in the joint interface between the second ceramic plate 3 and the electrode layer 4 can be suppressed. As a result, the breakdown of the ceramic joined body 1 caused by discharge can be suppressed.

(Ceramic Plate)

Shapes of outer peripheries of overlapping surfaces of the first ceramic plate 2 and the second ceramic plate 3 are made the same.

The thicknesses of the first ceramic plate 2 and the second ceramic plate 3 are not particularly limited and can be appropriately adjusted depending on the use of the ceramic joined body 1.

The first ceramic plate 2 and the second ceramic plate 3 have the same composition or the same major component. The first ceramic plate 2 and the second ceramic plate 3 are preferably formed of a composite body of an insulating material and a conductive material but may be formed of an insulating material.

The insulating material in the first ceramic plate 2 and the second ceramic plate 3 is not particularly limited, and examples thereof include aluminum oxide ($Al_2O_3$), aluminum nitride (AlN), yttrium oxide ($Y_2O_3$), and yttrium-aluminum-garnet (YAG). In particular, $Al_2O_3$ or AlN is preferable.

The conductive material in the first ceramic plate 2 and the second ceramic plate 3 may be a conductive ceramic or may be a conductive material such as a carbon material. The conductive material in the first ceramic plate 2 and the second ceramic plate 3 is not particularly limited, and examples thereof include silicon carbide (SiC), titanium oxide ($TiO_2$), titanium nitride (TiN), titanium carbide (TiC), a carbon material, rare earth oxide, and rare earth fluoride. Examples of the carbon material include carbon nanotubes (CNT) and carbon nanofibers. In particular, SiC is preferable.

The material of the first ceramic plate 2 and the second ceramic plate 3 is not particularly limited as long as it has a volume specific resistance value of about $10^{13}$ Ω·cm or more and $10^{17}$ Ω·cm or less, has a mechanical strength, and has durability to corrosive gas and plasma thereof. Examples of the material include an $Al_2O_3$ sintered compact, an AlN sintered compact, and an $Al_2O_3$—SiC composite sintered compact. From the viewpoints of dielectric characteristics, high corrosion resistance, plasma resistance, and heat resistance at a high temperature, it is preferable that the material of the first ceramic plate 2 and the second ceramic plate 3 is an $Al_2O_3$—SiC composite sintered compact.

The average primary particle diameter of the insulating material forming the first ceramic plate 2 and the second ceramic plate 3 is preferably 0.5 μm or more and 3.0 μm or less, more preferably 0.7 μm or more and 2.0 μm or less, and still more preferably 1.0 μm or more and 2.0 μm or less.

When the average primary particle diameter of the insulating material forming the first ceramic plate 2 and the second ceramic plate 3 is 0.5 μm or more and 3.0 μm or less, the first ceramic plate 2 and the second ceramic plate 3 that are dense, have high voltage endurance, and have high durability can be obtained.

A method of measuring the average primary particle diameter of the insulating material forming the first ceramic plate 2 and the second ceramic plate 3 is as follows. Using a field emission scanning electron microscope (FE-SEM; manufactured by JEOL Ltd., JSM-7800F-Prime), a cut surface of the first ceramic plate 2 and the second ceramic plate 3 in the thickness direction was observed at a magnification of 10000-fold, and the average particle diameter of 200 particles of the insulating material was obtained as the average primary particle diameter using an intercept method.

(Electrode Layer)

The electrode layer 4 is configured to be used as, for example, an electrode for plasma generation that applies high frequency power to generate plasma for a plasma treatment, an electrode for an electrostatic chuck that generates charges and fixes a plate-shaped sample due to an electrostatic adsorption force, or a heater electrode that heats a plate-shaped sample by electric heating. The shape of the electrode layer 4 (the shape of the electrode layer 4 when seen in a plan view) or the size thereof (the thickness or the area of the electrode layer 4 when seen in a plan view) is not particularly limited and is appropriately adjusted depending on the use of the ceramic joined body 1.

The electrode layer 4 is formed of a compound material (sintered compact) of particles of an insulating ceramic (insulating material) and particles of a conductive ceramic (conductive material).

The insulating ceramic in the electrode layer 4 is not particularly limited and is preferably, for example, at least one selected from the group consisting of $Al_2O_3$, AlN, silicon nitride ($Si_3N_4$), $Y_2O_3$, YAG, samarium-aluminum oxide ($SmAlO_3$), magnesium oxide (MgO), and silicon oxide ($SiO_2$).

The conductive ceramic (conductive material) in the electrode layer 4 is preferably at least one selected from the group consisting of SiC, $TiO_2$, TiN, TiC, tungsten (W), tungsten carbide (WC), molybdenum (Mo), molybdenum carbide ($Mo_2C$), a carbon material, and a conductive composite sintered compact.

Examples of the carbon material include carbon black, carbon nanotubes, and carbon nanofibers.

Examples of the conductive composite sintered compact include $Al_2O_3$—$Ta_4C_5$, $Al_2O_3$—W, $Al_2O_3$—SiC, AlN—W, and AlN—Ta.

The conductive material in the electrode layer 4 is formed of at least one selected from the group consisting of the above-described materials such that the conductivity of the electrode layer can be secured.

The electrode layer 4 is formed of the conductive material and the insulating material, and the joint strength of the first ceramic plate 2 and the second ceramic plate 3 and the mechanical strength as an electrode are strong.

The insulating material in the electrode layer 4 is $Al_2O_3$ such that dielectric characteristics, high corrosion resistance, plasma resistance, and heat resistance at a high temperature are maintained.

A ratio (mixing ratio) between the contents of the conductive material and the insulating material in the electrode layer 4 is not particularly limited and is appropriately adjusted depending on the use of the ceramic joined body 1.

The electrode layer 4 may have the same relative density as a whole. In addition, the density of the electrode layer 4 in the outer edge may be lower than that at the center of the electrode layer 4. The density (relative density) of the electrode layer 4 is obtained from a microscope image of the cross-section of the ceramic joined body 1.

(Method of Measuring Relative Density of Electrode Layer)

Specifically, the cross-section shown in FIG. 1 is imaged using a microscope (for example, a digital microscope (VFX-900F), manufactured by Keyence Corporation) at a magnification of 1000-fold to obtain a microscope image. When the relative density of the outer edge of the electrode layer 4 is measured, the imaging range is a region of the outer edge of the electrode layer 4 overlapping the joint surface 5 in a plan view. In the cross-sectional view shown in FIG. 1, in a case where a line parallel to the Y-axis is drawn from the position B toward the first ceramic plate 2, when an intersection position between the parallel line and the first ceramic plate 2 is set as a position C, an outer edge portion of the electrode layer 4 surrounded by the positions A, B, and C corresponds to the imaging range. Hereinafter, "the outer edge portion of the electrode layer 4 surrounded by the positions A, B, and C" will be referred to as "density measurement region".

In the microscope image, in a virtual plane overlapping the cross-section of the electrode layer 4, a region (a region where the material is present; a region 1) where the conductive ceramic and the insulating ceramic forming the electrode layer 4 are present and a "pore" region (a region 2) where both of the conductive ceramic and the insulating ceramic are not present can be distinguished from each other.

The relative density of the outer edge of the electrode layer 4 is a value obtained by expressing the area of a portion within an outer contour of the density measurement region, that is, a ratio of the area of the region 1 to the total area of the region 1 and the region 2 in percentage. When pores are not present in the electrode layer 4, the relative density of the density measurement region is 100%.

In addition, when the relative density of the center of the electrode layer 4 is measured, the imaging range is a region (center) including the center of the electrode layer 4 in the X direction. When it can be determined from the microscope image that the imaging range has the same density as that of the center of the electrode layer 4, the imaging range does not need to include the center of the electrode layer 4 to be exact.

In the obtained microscope image, by setting the electrode layer 4 in a range having a width of 150 µm in the X direction as "density measurement region" and performing the calculation using the same method as that of the density of the outer edge of the electrode layer 4, the relative density of the center of the electrode layer 4 can be obtained.

By comparing the relative densities obtained as described above to each other, whether or not the outer edge of the electrode layer 4 has a lower density than the center of the electrode layer 4 can be determined.

When the outer edge of the electrode layer 4 has a lower density, the relative density of the outer edge of the electrode layer 4 is preferably 50% or more and more preferably 55% or more. When the relative density of the outer edge of the electrode layer 4 is less than 50%, resistance heating is more likely to occur as compared to a case where the outer edge of the electrode layer 4 has a higher density, and in-plane temperature uniformity during application of high frequency power is likely to deteriorate. On the other hand, in the ceramic joined body where the relative density of the outer edge of the electrode layer 4 is 50% or more, in-plane temperature uniformity during application of high frequency power is maintained.

For example, a region where the relative density of the electrode layer 4 is 100% includes the center in the X direction and accounts for 95% or more with respect to the total width, and a region where the relative density of the electrode layer 4 is lower than that of the center accounts for 5% or less in total including 2.5% from each of opposite end portions in the X direction.

In the ceramic joined body 1 according to the embodiment, in the outer edge of the electrode layer 4, the joint surface 5 between the second ceramic plate 3 and the electrode layer 4 has an inclination with respect to the thickness direction (the Y direction in FIG. 1) of the pair of ceramic plates 2 and 3 and the electrode layer 4. Although described below in detail, in the ceramic joined body 1 having the above-described configuration, an outer end surface of the electrode layer 4 and the second ceramic plate 3 are likely to be joined to each other during production, the formation of voids between the second ceramic plate 3 and the electrode layer 4 can be suppressed, and the second ceramic plate 3 and the electrode layer 4 can sufficiently adhere to each other. Thus, when a high voltage is applied to the ceramic joined body 1, discharge in a joint interface between the second ceramic plate 3 and the electrode layer 4 can be suppressed. As a result, the breakdown of the ceramic joined body 1 caused by discharge can be suppressed.

Other Embodiments

The present invention is not limited to the above-described embodiment.

Figure 2:
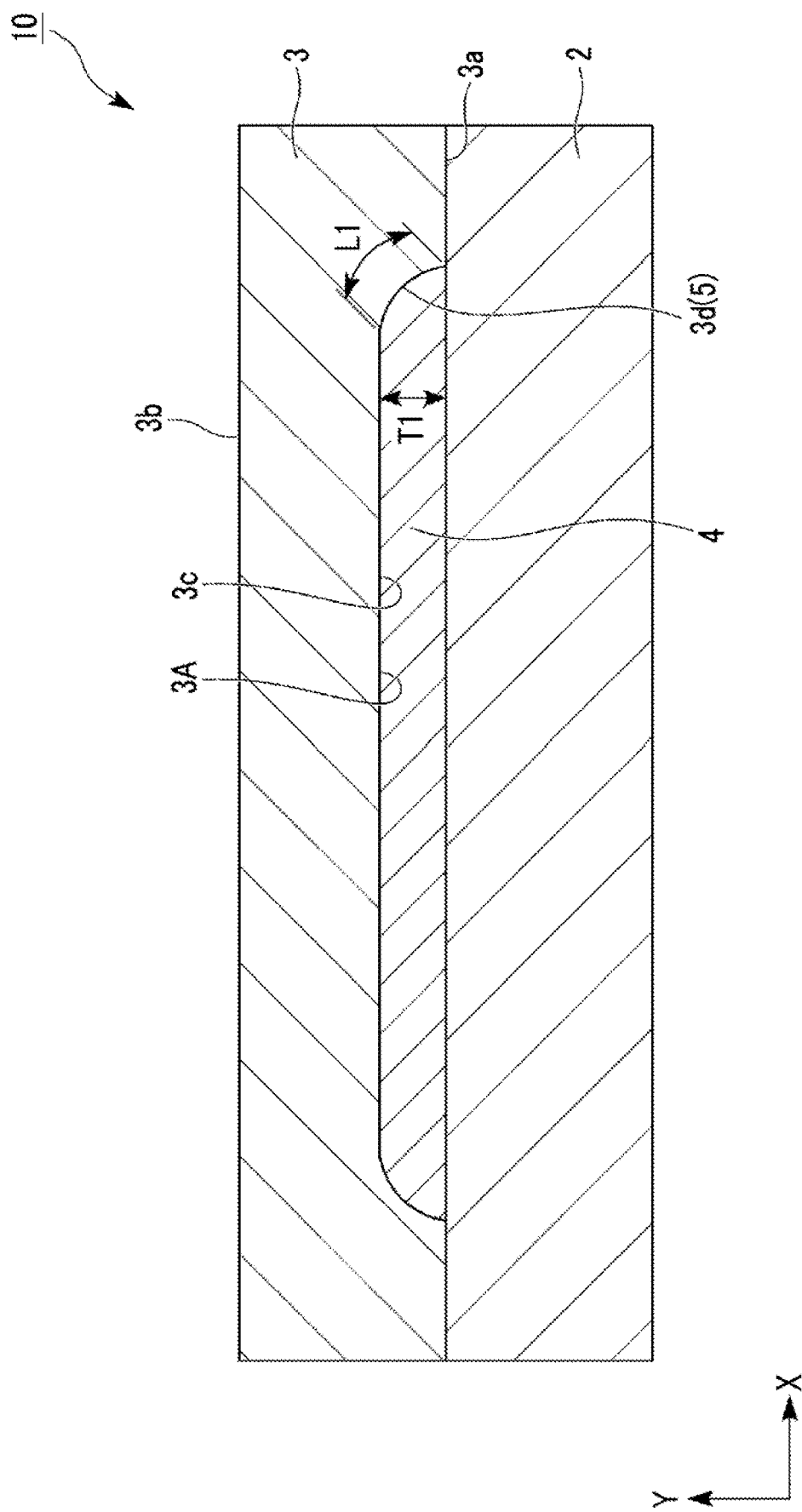
FIG. 2 is a cross-sectional view showing the ceramic joined body according to the embodiment of the present invention.
Figure 3:
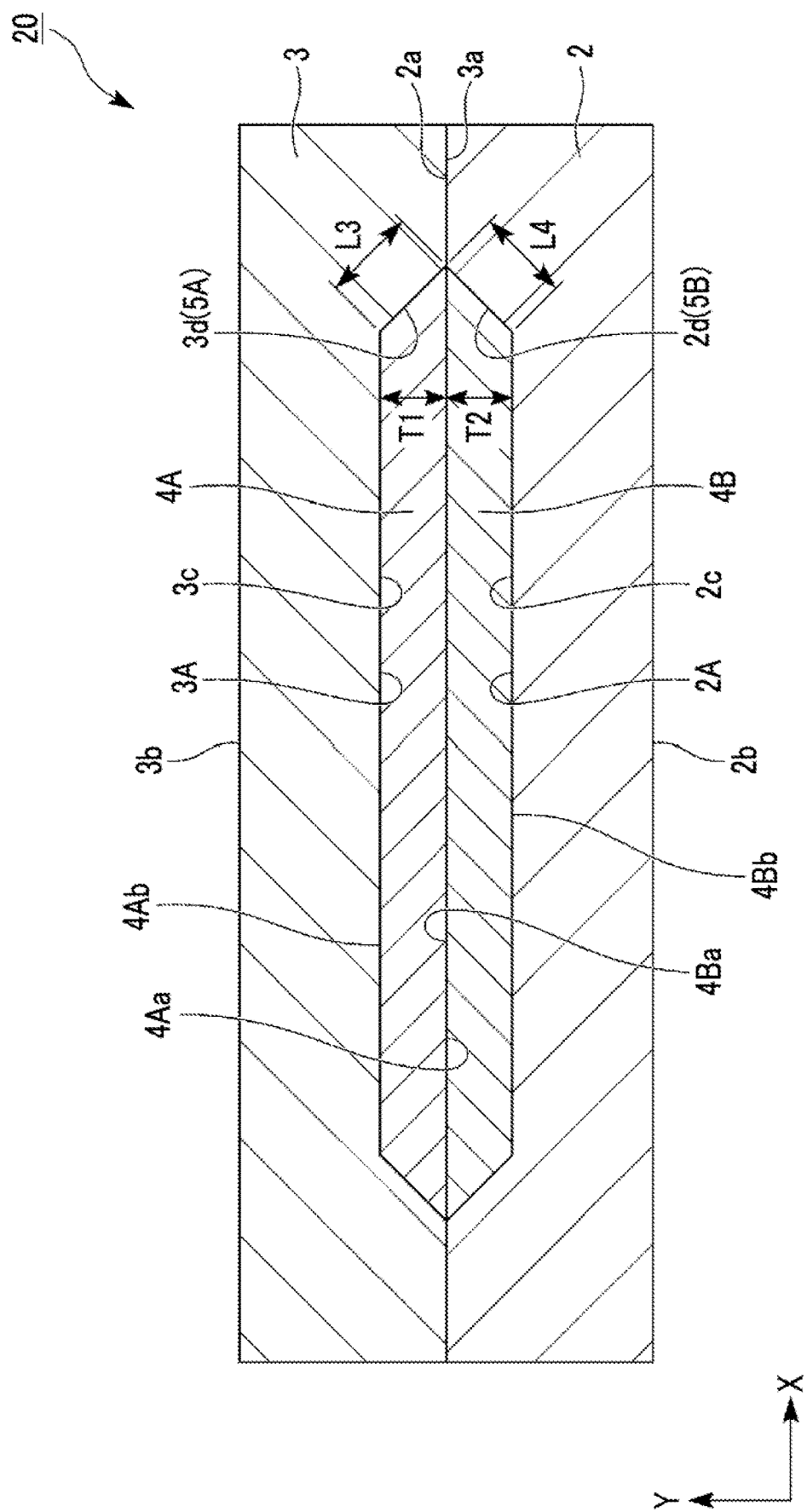
FIG. 3 is a cross-sectional view showing the ceramic joined body according to the embodiment of the present invention.
Figure 4:
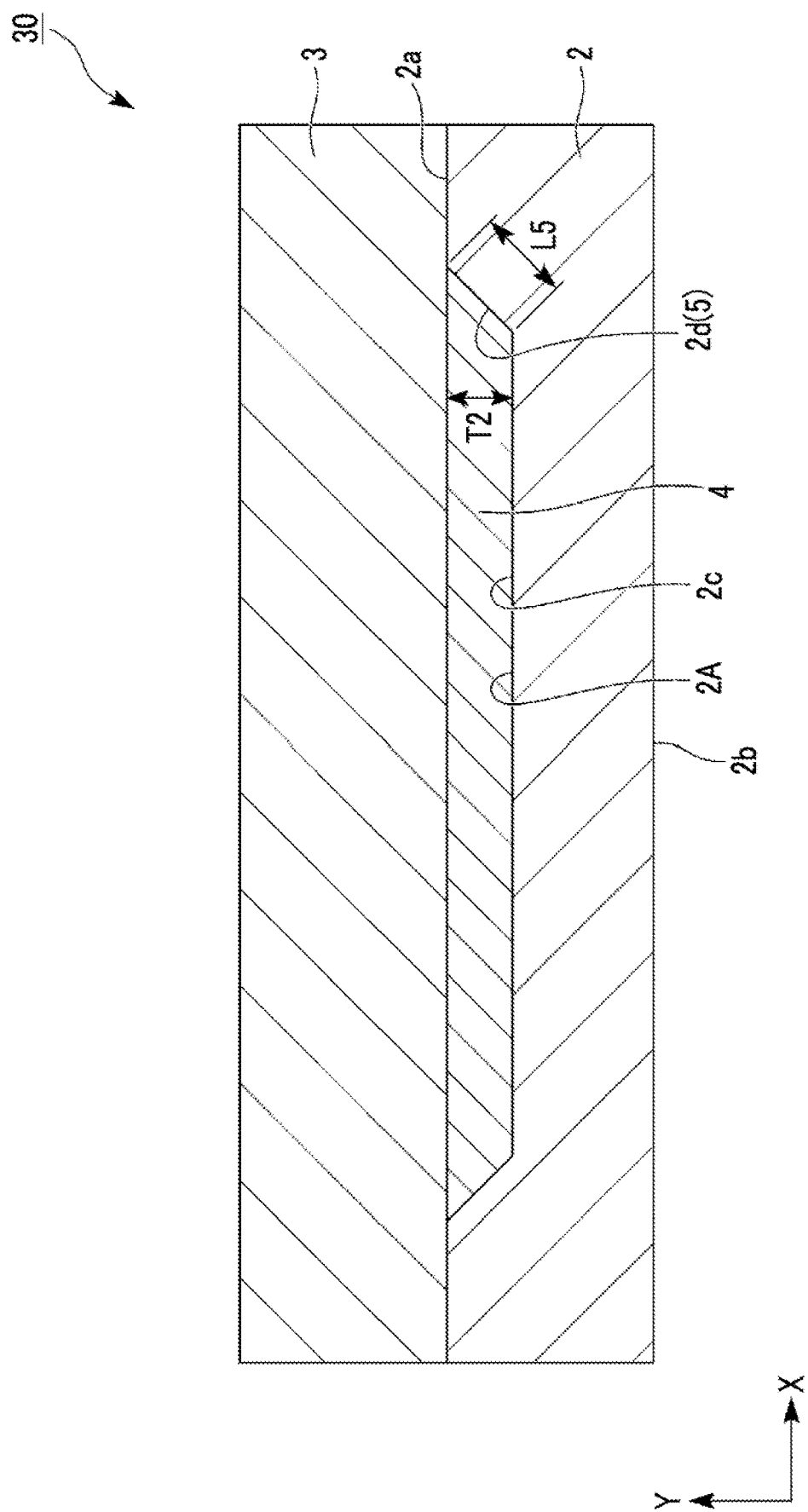
FIG. 4 is a cross-sectional view showing the ceramic joined body according to the embodiment of the present invention.

For example, modification examples shown in FIGS. 2 to 4 may be adopted. In the modification examples, the same portions as the components in the first embodiment will be represented by the same reference numerals, the description thereof will not be repeated, and only different points will be described. FIGS. 2 to 4 are cross-sectional views showing ceramic joined bodies according to the modification examples, and are cross-sectional views corresponding to FIG. 1.

Modification Example 1

In a ceramic joined body 10 according to the modification example shown in FIG. 2, in the outer edge of the electrode layer 4, the joint surface 5 between the second ceramic plate 3 and the electrode layer 4 has an inclination with respect to the thickness direction (the Y direction in FIG. 2) of the pair of ceramic plates 2 and 3 and the electrode layer 4.

In the second ceramic plate 3, the recess portion 3A that is recessed (in the thickness direction of the second ceramic plate 3) from the joint surface 3a with the first ceramic plate 2 toward the surface 3b side opposite to the joint surface 3a is formed. The recess portion 3A includes: the bottom surface 3c parallel to the surface 3b of the second ceramic plate 3; and the inclined surface 3d that is inclined in a curved shape with respect to the thickness direction of the second ceramic plate 3. The inclined surface 3d projects in the +Y direction.

The electrode layer 4 is formed of an electrode layer coating film that is formed by applying (filling) a paste for forming an electrode layer to the recess portion 3A. Accordingly, the joint surface 5 between the second ceramic plate 3 and the electrode layer 4 is the same as the inclined surface 3d of the recess portion 3A.

The outer edge of the electrode layer 4 has an inclination complementary to the inclined surface 3d of the second ceramic plate 3, and has an inclination complementary to the joint surface 5.

As shown in FIG. 2, it is preferable that a length L2 of the joint surface 5 (curved surface) between the second ceramic plate 3 and the electrode layer 4 is more than the thickness T1 of the electrode layer 4. The length L2 can be defined using the same method as that of the length L1.

In the ceramic joined body 10, the formation of voids between the second ceramic plate 3 and the electrode layer 4 can be suppressed, and the second ceramic plate 3 and the electrode layer 4 can sufficiently adhere to each other. Thus, when a high voltage is applied to the ceramic joined body 10, discharge in a joint interface between the second ceramic plate 3 and the electrode layer 4 can be suppressed. As a result, the breakdown of the ceramic joined body 10 caused by discharge can be suppressed.

Modification Example 2

In a ceramic joined body 20 according to the modification example shown in FIG. 3, in the outer edge of the electrode layer 4, a joint surface 5A between the second ceramic plate 3 and an electrode layer 4A has an inclination with respect to the thickness direction (the Y direction in FIG. 3) of the pair of ceramic plates 2 and 3 and the electrode layer 4A. As a result, when surfaces 4Aa and 4Ab of the electrode layer 4A facing each other in the Y direction are compared, the surface 4Aa on the -Y side is wider than the surface 4Ab on the +Y side in contact with the second ceramic plate 3.

In addition, in the outer edge of the electrode layer 4, a joint surface 5B between the first ceramic plate 2 and an electrode layer 4B has an inclination with respect to the thickness direction (the Y direction in FIG. 3) of the pair of ceramic plates 2 and 3 and the electrode layer 4B. As a result, when surfaces 4Ba and 4Bb of the electrode layer 4B facing each other in the Y direction are compared, the surface 4Ba on the +Y side is wider than the surface 4Bb on the -Y side in contact with the first ceramic plate 2.

The electrode layer 4A and the electrode layer 4B are in contact with each other in a virtual plane including the joint surface 3a of the second ceramic plate 3 with the first ceramic plate 2 and a joint surface 2a of the first ceramic plate 2 with the second ceramic plate 3. The electrode layer 4A and the electrode layer 4B are integrated in the virtual plane.

In addition, a tip (end portion in the ±X direction) of the electrode layer 4A and a tip (end portion in the ±X direction) of the electrode layer 4B are in contact with each other in the virtual plane.

In the second ceramic plate 3, the recess portion 3A that is recessed in the +Y direction (in the thickness direction of the second ceramic plate 3) from the joint surface 3a with the first ceramic plate 2 toward the surface 3b side opposite to the joint surface 3a is formed. The recess portion 3A includes: the bottom surface 3c parallel to the surface 3b of the second ceramic plate 3; and the inclined surface 3d that is inclined obliquely with respect to the thickness direction of the second ceramic plate 3.

In the first ceramic plate 2, a recess portion 2A that is recessed in the -Y direction (in the thickness direction of the first ceramic plate 2) from the joint surface 2a with the second ceramic plate 3 toward a surface 2b side opposite to the joint surface 2a is formed. An opening diameter of the recess portion 2A decreases in the -Y direction. The recess portion 2A includes: a bottom surface 2c parallel to the surface 2b of the first ceramic plate 2; and an inclined surface 2d that is inclined obliquely with respect to the thickness direction of the first ceramic plate 2. The inclined surface 2d of the recess portion 2A is a surface that is inclined from the bottom surface 2c toward the joint surface 2a side.

The electrode layer 4A is formed of an electrode layer coating film that is formed by applying (filling) a paste for forming an electrode layer to the recess portion 3A. Accordingly, the joint surface 5A between the second ceramic plate 3 and the electrode layer 4A is the same as the inclined surface 3d of the recess portion 3A.

The electrode layer 4B is formed of an electrode layer coating film that is formed by applying (filling) a paste for forming an electrode layer to the recess portion 2A. Accordingly, the joint surface 5B between the first ceramic plate 2 and the electrode layer 4B is the same as the inclined surface 2d of the recess portion 2A.

The outer edge of the electrode layer 4A has an inclination complementary to the inclined surface 3d of the second ceramic plate 3, and has an inclination complementary to the joint surface 5A. In addition, the outer edge of the electrode layer 4B has an inclination complementary to the inclined surface 2d of the first ceramic plate 2, and has an inclination complementary to the joint surface 5B.

As shown in FIG. 3, it is preferable that a length L3 of the joint surface 5A (slope) between the second ceramic plate 3 and the electrode layer 4A is more than the thickness T1 of the electrode layer 4A. The length L3 can be defined using the same method as that of the length L1. In the ceramic joined body 20, the formation of voids between the second ceramic plate 3 and the electrode layer 4A can be suppressed, and the second ceramic plate 3 and the electrode layer 4A can sufficiently adhere to each other.

In addition, as shown in FIG. 3, it is preferable that a length L4 of the joint surface 5B (slope) between the first ceramic plate 2 and the electrode layer 4B is more than a thickness T2 of the electrode layer 4B. The length L4 can be defined using the same method as that of the length L1. In the ceramic joined body 20, the formation of voids between the first ceramic plate 2 and the electrode layer 4B can be suppressed, and the first ceramic plate 2 and the electrode layer 4B can sufficiently adhere to each other.

Thus, when a high voltage is applied to the ceramic joined body 20, discharge in a joint interface between the second ceramic plate 3 and the electrode layer 4A and in a joint interface between the first ceramic plate 2 and the electrode layer 4B can be suppressed. As a result, the breakdown of the ceramic joined body 1 caused by discharge can be suppressed.

Modification Example 3

In a ceramic joined body 30 according to the modification example shown in FIG. 4, in the outer edge of the electrode layer 4, the joint surface 5 between the second ceramic plate 3 and the electrode layer 4 has an inclination with respect to the thickness direction (the Y direction in FIG. 4) of the pair of ceramic plates 2 and 3 and the electrode layer 4.

In the first ceramic plate 2, a recess portion 2A that is recessed (in the thickness direction of the first ceramic plate 2) from the joint surface 2a with the second ceramic plate 3 toward a surface 2b side opposite to the joint surface 2a is formed. The recess portion 2A includes: the bottom surface 2c parallel to the surface 2b of the first ceramic plate 2; and the inclined surface 2d that is inclined obliquely with respect to the thickness direction of the first ceramic plate 2.

The electrode layer 4 is formed of an electrode layer coating film that is formed by applying (filling) a paste for forming an electrode layer to the recess portion 2A. Accordingly, the joint surface 5 between the first ceramic plate 2 and the electrode layer 4 is the same as the inclined surface 2d of the recess portion 2A.

The outer edge of the electrode layer 4 has an inclination complementary to the inclined surface 2d of the first ceramic plate 2, and has an inclination complementary to the joint surface 5.

As shown in FIG. 4, it is preferable that a length L5 of the joint surface 5 (slope) between the first ceramic plate 2 and the electrode layer 4 is more than a thickness T2 of the electrode layer 4. The length L5 can be defined using the same method as that of the length L1. In the ceramic joined body 30, the formation of voids between the first ceramic plate 2 and the electrode layer 4 can be suppressed, and the first ceramic plate 2 and the electrode layer 4 can sufficiently adhere to each other. Thus, when a high voltage is applied to the ceramic joined body 30, discharge in a joint interface between the first ceramic plate 2 and the electrode layer 4 can be suppressed. As a result, the breakdown of the ceramic joined body 30 caused by discharge can be suppressed.

[Method for Producing Ceramic Joined Body]

A method for producing the ceramic joined body according to the embodiment includes: a step (hereinafter, referred to as "first step") of forming a recess portion on a surface of at least one of a pair of ceramic plates where the pair of ceramic plates overlap each other, the recess portion having an inclined surface that is inclined with respect to a thickness direction of the pair of ceramic plates; a step (hereinafter, referred to as "second step") of applying a paste for forming an electrode layer to the recess portion to form an electrode layer coating film; a step (hereinafter, referred to as "third step") of laminating the pair of ceramic plates such that the surface where the electrode layer coating film is formed faces inward; and a step (hereinafter, referred to as "fourth step") of pressurizing the laminate including the pair of ceramic plates and the electrode layer coating film in the thickness direction while heating the laminate.

Hereinafter, the method for producing the ceramic joined body according to the embodiment will be described with reference to FIG. 1.

In the first step, the recess portion 3A having the inclined surface 3d that is inclined with respect to the thickness direction of the second ceramic plate 3 is formed, for example, on the joint surface 3a of the second ceramic plate 3.

In order to form the recess portion 3A, the joint surface 3a of the second ceramic plate 3 may be ground or polished.

In the second step, the paste for forming an electrode layer is applied to the recess portion 3A using a coating method such as a screen printing method to form a coating film (electrode layer coating film) for forming the electrode layer 4. The outer edge of the electrode layer coating film has an inclination complementary to the inclined surface 3d of the second ceramic plate 3.

As the paste for forming an electrode layer, a dispersion liquid in which particles of the insulating ceramic and particles of the conductive ceramic for forming the electrode layer 4 are dispersed in a solvent is used.

As the solvent in the paste for forming an electrode layer, an alcohol such as isopropyl alcohol is used.

In the third step, the first ceramic plate 2 is laminated on the joint surface 3a of the second ceramic plate 3 such that the surface where the electrode layer coating film is formed faces inward.

In the fourth step, the laminate including the first ceramic plate 2, the electrode layer coating film, and the second ceramic plate 3 is pressurized in the thickness direction while being heated.

The atmosphere in which the laminate is pressurized in the thickness direction while being heated is preferably a vacuum or an inert atmosphere such as Ar, He, or $N_2$. Here, "vacuum" refers to "a state of a space filled with a gas at a pressure lower than the typical atmospheric pressure" as described in JIS Z 8126-1:1999.

A temperature (heat treatment temperature) at which the laminate is heated is preferably 1400° C. or higher and 1900° C. or lower and more preferably 1500° C. or higher and 1850° C. or lower.

When the temperature at which the laminate is heated is 1400° C. or higher and 1900° C. or lower, the solvent in each of the coating films is volatilized such that the electrode layer 4 can be formed between the first ceramic plate 2 and the second ceramic plate 3. In addition, the first ceramic plate 2 and the second ceramic plate 3 can be joined and integrated through the electrode layer 4.

The pressure (welding pressure) at which the laminate is pressurized in the thickness direction is preferably 1.0 MPa or more and 50.0 MPa or less and more preferably 5.0 MPa or more and 20.0 MPa or less.

When the pressure at which the laminate is pressurized in the thickness direction is 1.0 MPa or more and 50.0 MPa or less, the electrode layer 4 can be formed between the first ceramic plate 2 and the second ceramic plate 3. In addition, the first ceramic plate 2 and the second ceramic plate 3 can be joined and integrated through the electrode layer 4.

For example, when the outer end surface of the electrode layer 4 is parallel to the Y-axis, a stress with which the second ceramic plate 3 is pressed toward the electrode layer 4 due to pressurization during sintering is not present.

Therefore, it is difficult to join the outer end surface of the electrode layer 4 and the second ceramic plate 3 to each other.

On the other hand, in the ceramic joined body 1 according to the embodiment, the electrode layer 4 is embedded in the recess portion 3A of the second ceramic plate 3, and the outer edge of the electrode layer 4 has an inclination complementary to the inclined surface 3d of the second ceramic plate 3. Therefore, due to the pressurization during sintering, a stress with which the second ceramic plate 3 is pressed from the inclined surface 3d of the second ceramic plate 3 is applied to the outer edge of the electrode layer 4. As a result, the outer end surface of the electrode layer 4 and the second ceramic plate 3 are likely to be joined to each other.

Therefore, in the method for producing the ceramic joined body according to the embodiment, in the outer edge of the electrode layer 4, the formation of voids in the joint surface 5 between the second ceramic plate 3 and the electrode layer 4 can be suppressed. As a result, in the method for producing the ceramic joined body according to the embodiment, the ceramic joined body 1 where, when a high voltage is applied to the electrode layer 4, discharge in the joint surface 5 can be suppressed and breakdown caused by discharge can be suppressed can be provided.

Ceramic Joined Body

Second Embodiment

Figure 5:
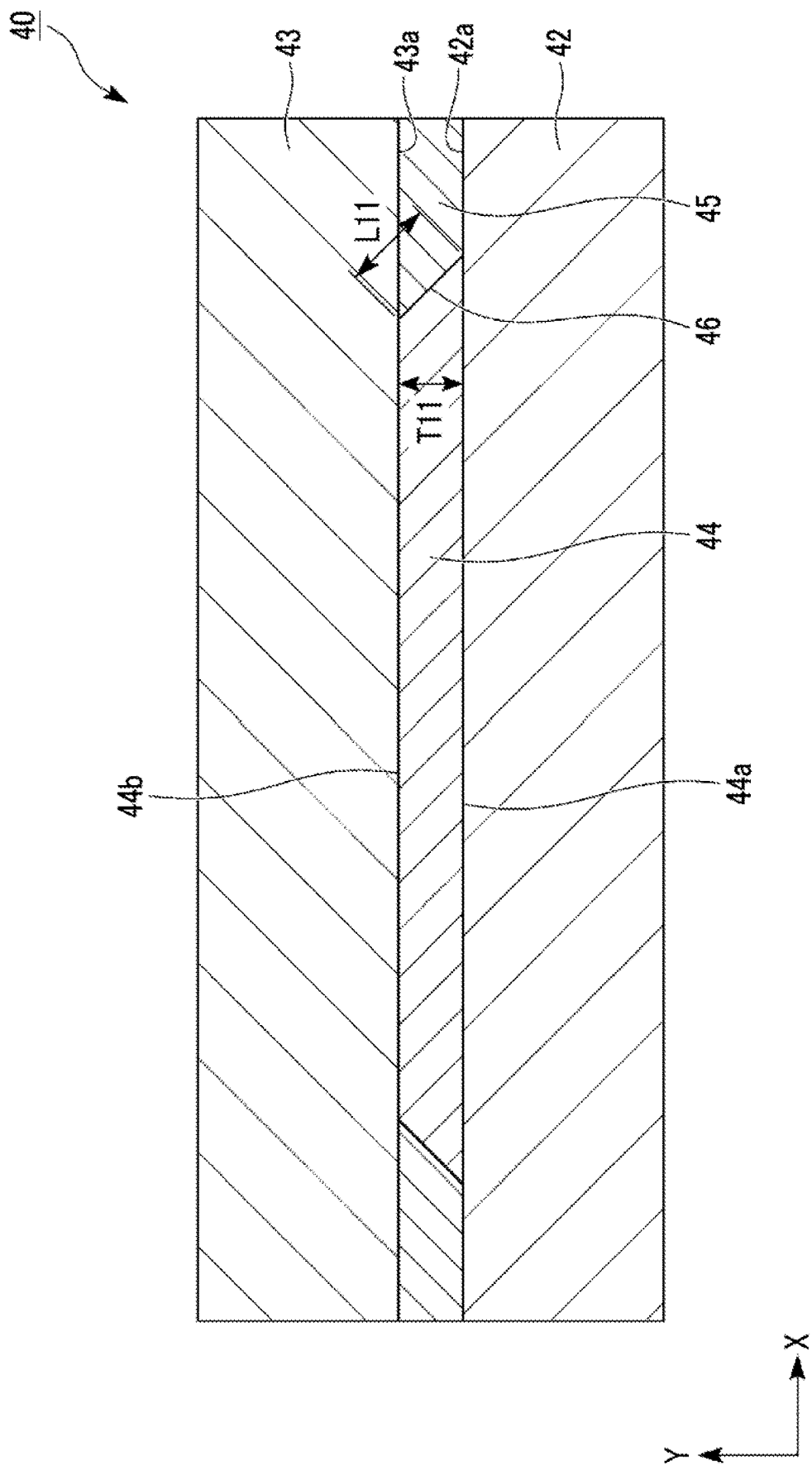
FIG. 5 is a cross-sectional view showing the ceramic joined body according to the embodiment of the present invention.

Hereinafter, a ceramic joined body according to one embodiment of the present invention will be described with reference to FIG. 5. In FIG. 5, note that a horizontal direction of the paper plane (width direction of the ceramic joined body) is an X direction and a vertical direction of the paper plane (thickness direction of the ceramic joined body) is a Y direction.

In all of the following drawings, dimensions, ratios, and the like of the components may be appropriately different from the actual ones in order to easily understand the drawings.

FIG. 5 is a cross-sectional view showing a ceramic joined body according to the embodiment, and is a cross-sectional view corresponding to FIG. 1. As shown in FIG. 5, a ceramic joined body 40 according to the embodiment includes: a pair of ceramic plates 42 and 43; and an electrode layer 44 and an insulating layer 45 that is interposed between the pair of ceramic plates 42 and 43.

Hereinafter, the ceramic plate 42 will be referred to as the first ceramic plate 42, and the ceramic plate 43 will be referred to as the second ceramic plate 43.

As shown in FIG. 5, in the ceramic joined body 40, the first ceramic plate 42, the electrode layer 44, the insulating layer 45, and the second ceramic plate 43 are laminated in this order. The insulating layer 45 is disposed in an annular shape in the periphery of the electrode layer 44 between the first ceramic plate 42 and the second ceramic plate 43. That is, the ceramic joined body 40 is a joined body where the first ceramic plate 42 and the second ceramic plate 43 are joined and integrated through the electrode layer 44 and the insulating layer 45.

In the ceramic joined body 40 according to the embodiment, the electrode layer 44 and the insulating layer 45 are provided on the same plane. The electrode layer 44 and the insulating layer 45 are provided in contact with both of a surface (one surface) 42a of the first ceramic plate 42 facing the second ceramic plate 43 and a surface (one surface) 43a of the second ceramic plate 43 facing the first ceramic plate 42.

The outer edge of the electrode layer 44 overlaps the insulating layer 45 in a plan view and is not exposed from the insulating layer 45 to the outside of the ceramic joined body 1. In the outer edge of the electrode layer 44, a joint surface 46 between the electrode layer 44 and the insulating layer 45 has an inclination with respect to the thickness direction (Y direction) of the pair of ceramic plates 42 and 43, the electrode layer 44, and the insulating layer 45. As a result, when surfaces 44a and 44b of the electrode layer 44 facing each other in the Y direction are compared, the surface 44a on the −Y side in contact with the first ceramic plate 42 is wider than the surface 44b on the +Y side in contact with the second ceramic plate 43.

The joint surface 46 has an inclined surface that is inclined obliquely with respect to the thickness direction (Y direction in FIG. 5) of the pair of ceramic plates 42 and 43, the electrode layer 44, and the insulating layer 45. The joint surface 46 is a surface that faces the surface 42a and is inclined from the one surface 43a of the second ceramic plate 43 toward the one surface 42a side of the first ceramic plate 42.

The outer edge of the electrode layer 44 has an inclination complementary to the inclined surface of the second ceramic plate 43, and has an inclination complementary to the joint surface 46.

As shown in FIG. 5, it is preferable that a length L11 of the joint surface 46 between the electrode layer 44 and the insulating layer 45 is more than a thickness T11 of the electrode layer 44. The length L11 can be defined using the same method as that of the length L1. In the ceramic joined body 40, the formation of voids between the electrode layer 44 and the insulating layer 45 can be suppressed, and the electrode layer 44 and the insulating layer 45 can sufficiently adhere to each other. Thus, when a high voltage is applied to the ceramic joined body 40, discharge in a joint interface between the electrode layer 44 and the insulating layer 45 can be suppressed. As a result, the breakdown of the ceramic joined body 40 caused by discharge can be suppressed.

As in the ceramic joined body 1 according to the first embodiment, voids between the electrode layer 44 and the insulating layer 45 are likely to be formed in the outer edge of the electrode layer 44.

A ratio (L11/T11) of the length L11 of the joint surface 46 to the thickness T11 of the electrode layer 44 is preferably 1.7 or more and 6.5 or less, more preferably 2.0 or more and 5.0 or less, and still more preferably 2.2 or more and 4.5 or less. L11>T11 is satisfied.

When the ratio (L11/T11) is in the above-described range, the formation of voids between the electrode layer 44 and the insulating layer 45 can be suppressed, and the electrode layer 44 and the insulating layer 45 can sufficiently adhere to each other. Thus, when a high voltage is applied to the ceramic joined body 40, charges are not likely to accumulate in the joint interface between the electrode layer 44 and the insulating layer 45. As a result, discharge caused by an electric field accumulated in the joint interface can be suppressed, and the breakdown of the ceramic joined body 40 caused by discharge can be suppressed.

When the ratio (L11/T11) is less than the lower limit value, the inclination of the joint surface 46 with respect to the Y direction during joining is reduced. Therefore, the adhesiveness between the electrode layer 44 and the insulating layer 45 deteriorates.

When the ratio (L11/T11) exceeds the upper limit value, the inclination of the joint surface 46 with respect to the Y direction increases, and the area of a portion (for example, a portion having a thickness less than ½ T11) that is thinner than the center of the electrode layer 44 in the outer edge of the electrode layer 44 increases to be more than that the ceramic joined body where L11/T11 is the upper limit value or less. In the ceramic joined body, when power is applied to the electrode layer 44, the amount of heat generated in the outer edge of the electrode layer 44 is more than the amount of heat generated at the center of the electrode layer 44, and The temperature in the outer edge of the electrode layer 4 is likely to be high. Therefore, in the ceramic joined body where L11/T11 exceeds the upper limit value, in-plane temperature uniformity during application of high frequency power deteriorates.

In the ceramic joined body where the ratio (L11/T11) is the lower limit value or more, the electrode layer 44 and the insulating layer 45 sufficiently adhere each other. In addition, in the ceramic joined body where L11/T11 is the upper limit value or less, in-plane temperature uniformity during application of high frequency power is maintained.

In the embodiment, "junction ratio of the joint surface 46 between the electrode layer 44 and the insulating layer 45" can be calculated from any scanning electron microscope image of the joint surface 46.

That is, in a freely selected field of view (cross-section that is freely prepared in the ceramic joined body 40), an electron microscope image at a magnification of 1000-fold is obtained, and the length of an inclined surface in the electron microscope image is set as "total length (L11) of the joint surface 46".

On the other hand, in the electron microscope image, a major axis length of each of voids formed between the electrode layer 44 and the insulating layer 45 is obtained, and the sum of the major axis lengths is set as "void length (D11) in the joint surface 46". "The major axis length (D11) corresponds to the length of a long side of a minimum rectangle circumscribing each of the voids.

Based on the lengths obtained as described above, a ratio of "the total length (L11) of the joint surface 46" to "the void length (D11) in the joint surface 46" is obtained in percentage, and the obtained value is subtracted from 100% to calculate a value as "the junction ratio of the joint surface 46 between the electrode layer 44 and the insulating layer 45".

The junction ratio of the joint surface 46 between the electrode layer 44 and the insulating layer 45 is preferably 25% or more, more preferably 40% or more, still more preferably 50% or more, and still more preferably 60% or more. In a case where the junction ratio of the joint surface 46 between the electrode layer 44 and the insulating layer 45 is the lower limit value or more, when a high voltage is applied to the ceramic joined body 40, discharge in the joint interface between the electrode layer 44 and the insulating layer 45 can be suppressed. As a result, the breakdown of the ceramic joined body 40 caused by discharge can be suppressed.

The ceramic plates 42 and 43 have the same configuration as the ceramic plates 2 and 3.

The electrode layer 44 has the same configuration as the electrode layer 4.

(Insulating Layer)

The insulating layer 45 is configured to be provided for joining boundary portions of the first ceramic plate 42 and the second ceramic plate 43, that is, outer edge regions other than a portion where the electrode layer 44 is formed. The shape of the insulating layer 45 (the shape of the insulating layer 45 when seen in a plan view) is not particularly limited and is appropriately adjusted depending on the shape of the electrode layer 44.

In the ceramic joined body 40 according to the embodiment, the thickness of the insulating layer 45 is the same as the thickness of the electrode layer 44.

The insulating layer 45 is formed of an insulating material.

The insulating material forming the insulating layer 45 is not particularly limited and is preferably the same as a major component of the first ceramic plate 42 and the second ceramic plate 43. Examples of the insulating material forming the insulating layer 45 include $Al_2O_3$, AlN, $Y_2O_3$, and YAG. The insulating material forming the insulating layer 45 is preferably $Al_2O_3$. The insulating material forming the insulating layer 45 is $Al_2O_3$ such that dielectric characteristics, high corrosion resistance, plasma resistance, and heat resistance at a high temperature are maintained.

The average primary particle diameter of the insulating material forming the insulating layer 45 is preferably 0.5 μm or more and 3.0 μm or less and more preferably 0.7 μm or more and 2.0 μm or less.

When the average primary particle diameter of the insulating material forming the insulating layer 45 is 0.5 μm or more, sufficient voltage endurance can be obtained. On the other hand, when the average primary particle diameter of the insulating material forming the insulating layer 45 is 3.0 μm or less, processing such as grinding is simple.

A method for measuring the average primary particle diameter of the insulating material forming the insulating layer 45 is the same as the method for measuring the average primary particle diameter of the insulating material forming the first ceramic plate 42 and the second ceramic plate 43.

In the ceramic joined body 40 according to the embodiment, in the outer edge of the electrode layer 44, the joint surface 46 between the electrode layer 44 and the insulating layer 45 has an inclination with respect to the thickness direction of the pair of ceramic plates 42 and 43, the electrode layer 44, and the insulating layer 45. In the ceramic joined body 40 having the above-described configuration, as in the ceramic joined body 1 according to the first embodiment, the outer end surface of the electrode layer 4 and the second ceramic plate 3 are likely to be joined to each other during production, the formation of voids between the electrode layer 44 and the insulating layer 45 can be suppressed, and the electrode layer 44 and the insulating layer 45 can sufficiently adhere to each other. Thus, when a high voltage is applied to the ceramic joined body 40, discharge in a joint interface between the electrode layer 44 and the insulating layer 45 can be suppressed. As a result, the breakdown of the ceramic joined body 40 caused by discharge can be suppressed.

Other Embodiments

The present invention is not limited to the above-described embodiment.

Figure 6:
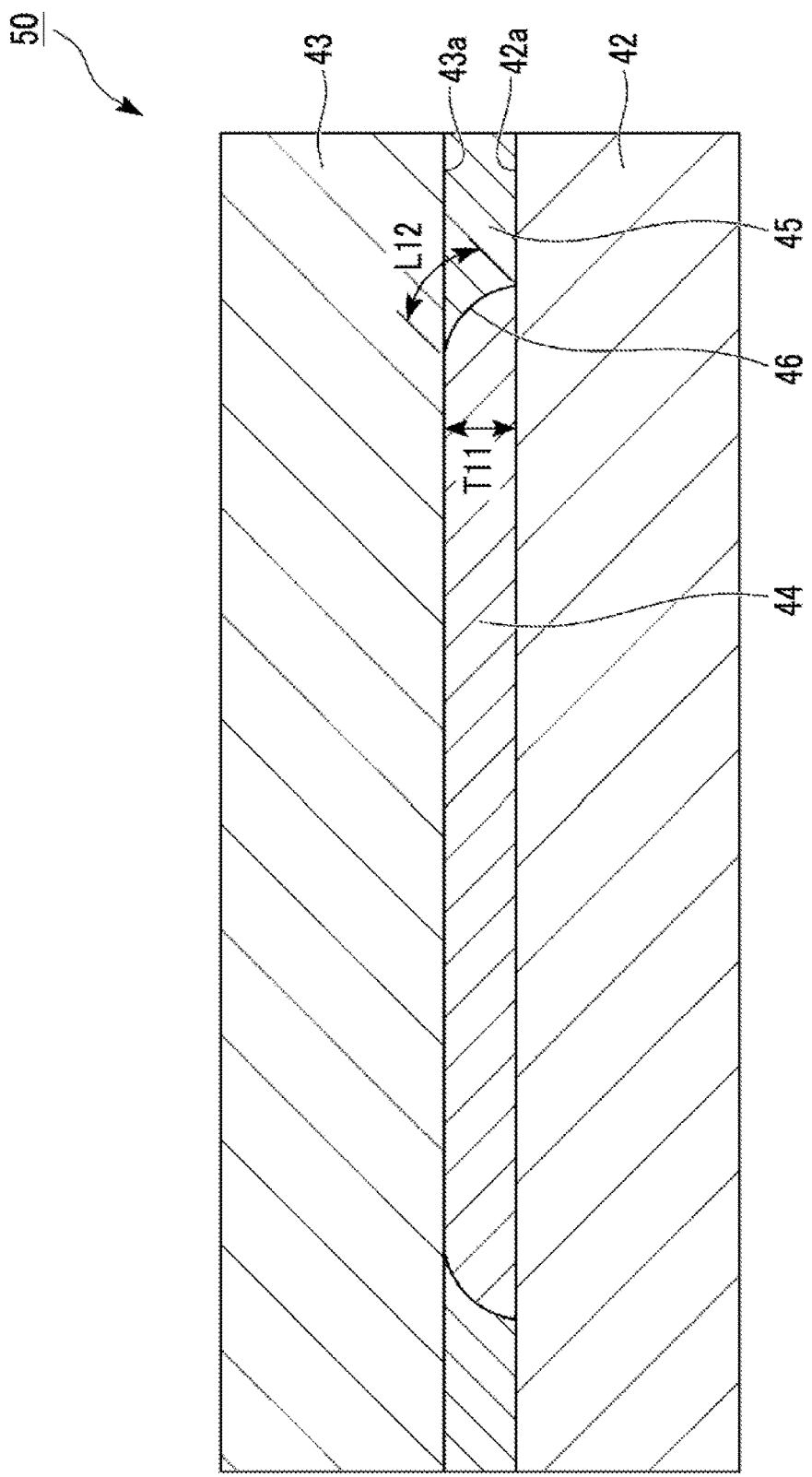
FIG. 6 is a cross-sectional view showing the ceramic joined body according to the embodiment of the present invention.
Figure 7:
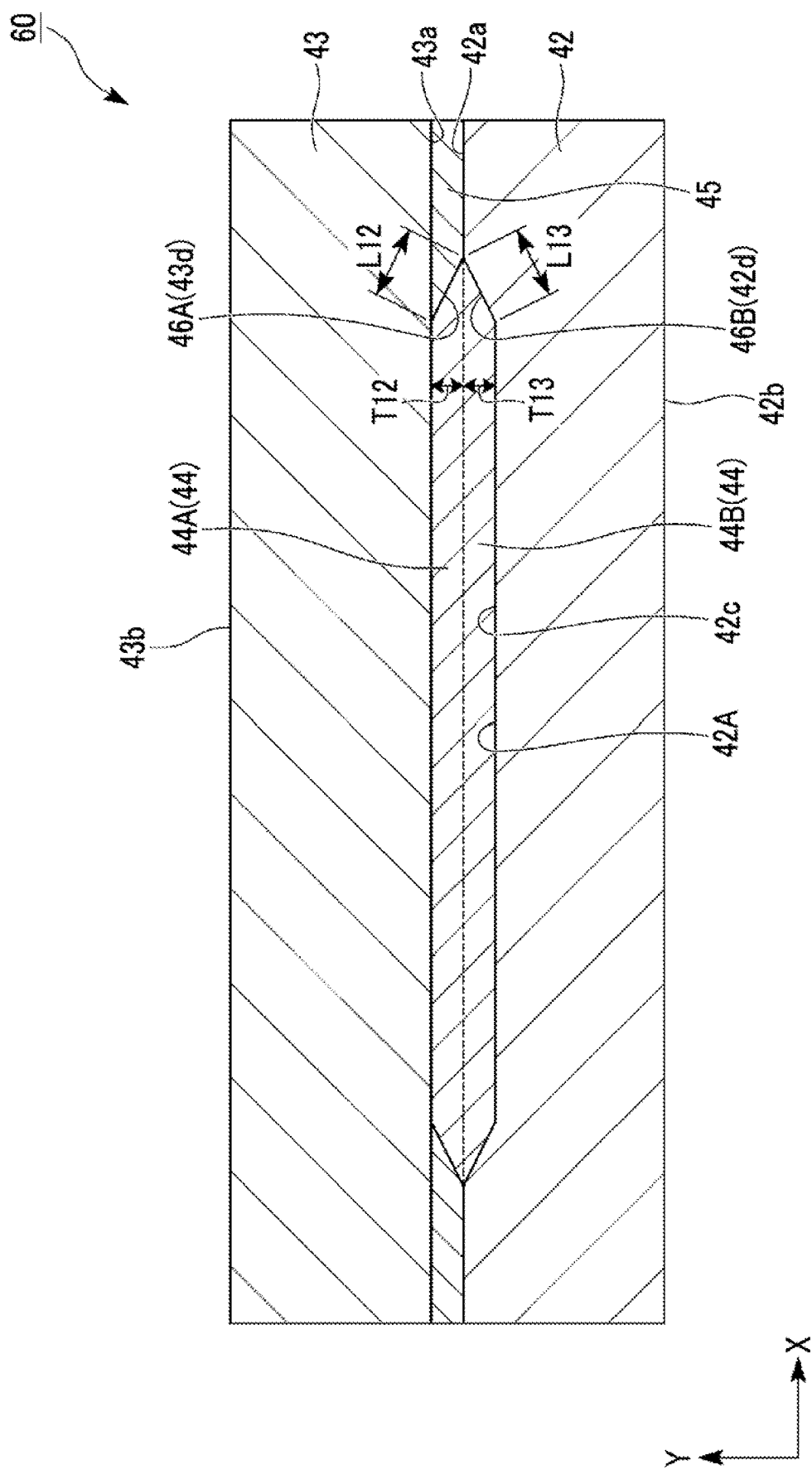
FIG. 7 is a cross-sectional view showing the ceramic joined body according to the embodiment of the present invention.
Figure 8:
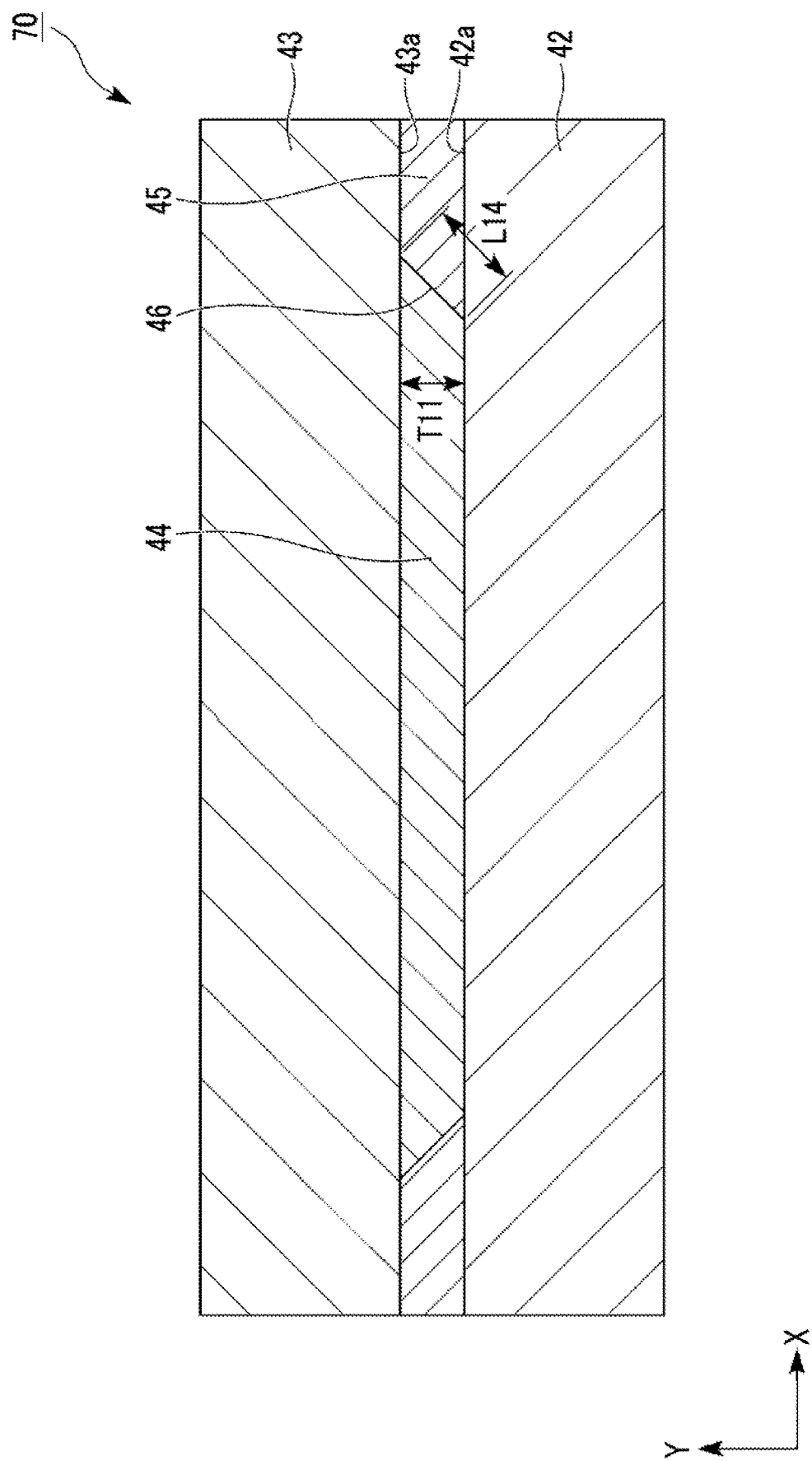
FIG. 8 is a cross-sectional view showing the ceramic joined body according to the embodiment of the present invention.

For example, modification examples shown in FIGS. 6 to 8 may be adopted. In the modification examples, the same portions as the components in the second embodiment will be represented by the same reference numerals, the description thereof will not be repeated, and only different points will be described. FIGS. 6 to 8 are cross-sectional views showing ceramic joined bodies according to the modification examples, and are cross-sectional views corresponding to FIG. 5.

Modification Example 1

In a ceramic joined body 50 according to the modification example shown in FIG. 6, in the outer edge of the electrode layer 44, the joint surface 46 between the electrode layer 44 and the insulating layer 45 has an inclination with respect to the thickness direction (Y direction in FIG. 6) of the pair of ceramic plates 42 and 43, the electrode layer 44, and the insulating layer 45.

The joint surface 46 has an inclined surface that is inclined in a curved shape with respect to the thickness direction (Y direction in FIG. 6) of the pair of ceramic plates 42 and 43, the electrode layer 44, and the insulating layer 45. The joint surface 46 projects in the +Y direction.

As shown in FIG. 6, it is preferable that a length L12 of the joint surface 46 (curved surface) between the electrode layer 44 and the insulating layer 45 is more than the thickness T11 of the electrode layer 44. The length L12 can be defined using the same method as that of the length L1.

In the ceramic joined body 50, the formation of voids between the electrode layer 44 and the insulating layer 45 can be suppressed, and the electrode layer 44 and the insulating layer 45 can sufficiently adhere to each other. Thus, when a high voltage is applied to the ceramic joined body 40, discharge in a joint interface between the electrode layer 44 and the insulating layer 45 can be suppressed. As a result, the breakdown of the ceramic joined body 40 caused by discharge can be suppressed.

Modification Example 2

In a ceramic joined body 60 according to the modification example shown in FIG. 7, a joint surface 46A between the electrode layer 44 and the insulating layer 45 has an inclination with respect to the thickness direction (Y direction in FIG. 7) of the pair of ceramic plates 42 and 43, the electrode layer 44, and the insulating layer 45.

In the first ceramic plate 42, a recess portion 42A that is recessed in the −Y direction (in the thickness direction of the first ceramic plate 42) from the surface 42a toward a surface 42b side opposite to the surface 42a is formed. An opening diameter of the recess portion 42A decreases in the −Y direction. The recess portion 42A includes: a bottom surface 42c parallel to the surface 42b of the first ceramic plate 42; and an inclined surface 42d that is inclined obliquely with respect to the thickness direction of the first ceramic plate 42. The inclined surface 42d of the recess portion 42A is a surface that faces the second ceramic plate 43 and is inclined from the bottom surface 42c toward the one surface 42a side.

The electrode layer 44 includes: an electrode layer 44B that is formed of an electrode layer coating film formed by applying (filling) a paste for forming an electrode layer to the recess portion 42A; and an electrode layer 44A that is formed of an electrode layer coating film formed by applying (filling) a paste for forming an electrode layer to the one surface 43a of the second ceramic plate 43. Accordingly, a joint surface 46B between the first ceramic plate 42 and the electrode layer 44B is the same as the inclined surface 42d of the recess portion 42A.

As shown in FIG. 7, it is preferable that the length L12 of the joint surface 46A between the electrode layer 44A and the insulating layer 45 is more than a thickness T12 of the electrode layer 44A. The length L12 can be defined using the same method as that of the length L1. In the ceramic joined body 60, the formation of voids between the electrode layer 44A and the insulating layer 45 can be suppressed, and the electrode layer 44A and the insulating layer 45 can sufficiently adhere to each other.

In addition, as shown in FIG. 7, it is preferable that a length L13 of the joint surface 46B between the first ceramic plate 42 and the electrode layer 44B is more than a thickness T13 of the electrode layer 44B. The length L13 can be defined using the same method as that of the length L1. In the ceramic joined body 60, the formation of voids between the first ceramic plate 42 and the electrode layer 44B can be suppressed, and the first ceramic plate 42 and the electrode layer 44B can sufficiently adhere to each other.

Thus, when a high voltage is applied to the ceramic joined body 60, discharge in a joint interface between the electrode layer 44A and the insulating layer 45 and in a joint interface between the first ceramic plate 42 and the electrode layer 44B can be suppressed. As a result, the breakdown of the ceramic joined body 60 caused by discharge can be suppressed.

Modification Example 3

In a ceramic joined body 70 according to the modification example shown in FIG. 8, in the outer edge of the electrode layer 44, the joint surface 46 between the electrode layer 44 and the insulating layer 45 has an inclination with respect to the thickness direction of the pair of ceramic plates 42 and 43, the electrode layer 44, and the insulating layer 45. The joint surface 46 has an inclined surface that is inclined obliquely with respect to the thickness direction (Y direction in FIG. 8) of the pair of ceramic plates 42 and 43, the electrode layer 44, and the insulating layer 45. The joint surface 46 is a surface that is inclined from the one surface 42a of the first ceramic plate 42 toward the one surface 43a side of the second ceramic plate 43.

As shown in FIG. 8, it is preferable that a length L14 of the joint surface 46 between the electrode layer 44 and the insulating layer 45 is more than the thickness T11 of the electrode layer 44. The length L14 can be defined using the same method as that of the length L1. In the ceramic joined body 70, the formation of voids between the electrode layer 44 and the insulating layer 45 can be suppressed, and the electrode layer 44 and the insulating layer 45 can sufficiently adhere to each other. Thus, when a high voltage is applied to the ceramic joined body 70, discharge in a joint interface between the electrode layer 44 and the insulating layer 45 can be suppressed. As a result, the breakdown of the ceramic joined body 70 caused by discharge can be suppressed.

[Method for Producing Ceramic Joined Body]

A method for producing the ceramic joined body according to the embodiment includes: a step (hereinafter, referred to as "first step") of applying a paste for forming an electrode layer to a surface of at least of a pair of ceramic plates where the pair of ceramic plates overlap each other to form an electrode layer coating film and applying a paste for forming an insulating layer to form an insulating layer coating film; a step (hereinafter, referred to as "second step") of laminating the pair of ceramic plates in a posture in which the surface where the electrode layer coating film and the insulating layer coating film are formed faces inward; and a step (hereinafter, referred to as "third step") of pressurizing the laminate including the pair of ceramic plates, the electrode layer coating film, and the insulating layer coating film in the thickness direction while heating the laminate.

Hereinafter, the method for producing the ceramic joined body according to the embodiment will be described with reference to FIG. 5.

In the first step, for example, using a coating method such as a screen printing method, the paste for forming an electrode layer is applied to the one surface 42a of the first ceramic plate 42 to form an electrode layer coating film, and the paste for forming an insulating layer is applied to form an insulating layer coating film. Any one of the electrode layer coating film or the insulating layer coating film may be formed first.

An outer edge of the formed electrode layer coating film and an inner edge of the formed insulating layer coating film overlap each other in a plan view, and a contact surface between the electrode layer coating film and the insulating layer coating film has an inclination with respect to the thickness direction of the one surface 42a of the first ceramic plate 42. Here, as shown in FIG. 5, the electrode layer coating film and the insulating layer coating film are formed such that the joint surface 46 is inclined from the one surface 43a of the second ceramic plate 43 toward the one surface 42a side of the first ceramic plate 42. The outer edge of the electrode layer coating film has an inclination complementary to the inner edge of the insulating layer coating film.

As the paste for forming an electrode layer, a dispersion liquid in which insulating ceramic particles and conductive ceramic particles for forming the electrode layer 44 are dispersed in a solvent is used. As the solvent in the paste for forming an electrode layer, an alcohol such as isopropyl alcohol is used.

As the paste for forming an insulating layer, a dispersion liquid in which the insulating ceramic for forming the insulating layer 45 is dispersed in a solvent is used. As the solvent in the paste for forming an insulating layer, an alcohol such as isopropyl alcohol is used.

In the second step, the second ceramic plate 43 is laminated on the one surface 42a of the first ceramic plate 42 such that the surface where the electrode layer coating film and the insulating layer coating film are formed faces inward.

In the third step, the laminate including the first ceramic plate 42, the electrode layer coating film, the insulating layer coating film, and the second ceramic plate 43 is pressurized in the thickness direction while being heated.

The atmosphere in which the laminate is pressurized in the thickness direction while being heated is preferably a vacuum or an inert atmosphere such as Ar, He, or $N_2$.

A temperature (heat treatment temperature) at which the laminate is heated is preferably 1600° C. or higher and 1900° C. or lower and more preferably 1650° C. or higher and 1850° C. or lower.

When the temperature at which the laminate is heated is 1600° C. or higher and 1900° C. or lower, the solvent in each of the coating films is volatilized such that the electrode layer 44 and the insulating layer 45 can be formed between the first ceramic plate 42 and the second ceramic plate 43. In addition, the first ceramic plate 42 and the second ceramic plate 43 can be joined and integrated through the electrode layer 44 and the insulating layer 45.

The pressure (welding pressure) at which the laminate is pressurized in the thickness direction is preferably 1.0 MPa or more and 50.0 MPa or less and more preferably 5.0 MPa or more and 20.0 MPa or less.

When the pressure at which the laminate is pressurized in the thickness direction is 1.0 MPa or more and 50.0 MPa or less, the electrode layer 44 and the insulating layer 45 that adhere to each other can be formed between the first ceramic plate 42 and the second ceramic plate 43. In addition, the first ceramic plate 42 and the second ceramic plate 43 can be joined and integrated through the electrode layer 44 and the insulating layer 45.

Therefore, in the method for producing the ceramic joined body according to the embodiment, in the outer edge of the electrode layer 44, the formation of voids in the joint surface 46 between the second ceramic plate 43 and the electrode layer 44 can be suppressed. As a result, the ceramic joined body 40 where, when a high voltage is applied to the electrode layer 44, discharge in the joint surface 46 can be suppressed and breakdown caused by discharge can be suppressed can be provided.

[Electrostatic Chucking Device]

Hereinafter, an electrostatic chucking device according to an embodiment of the present invention will be described with reference to FIG. 9.

Figure 9:
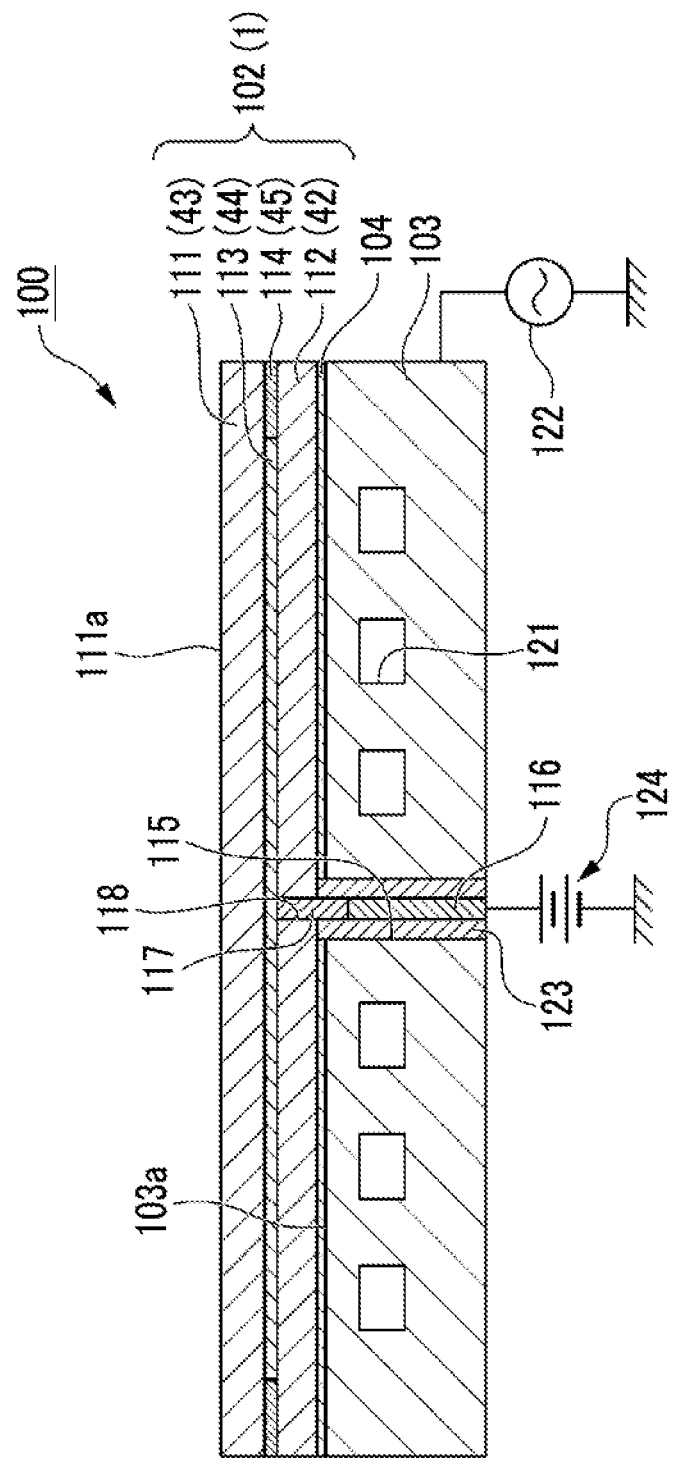
FIG. 9 is a cross-sectional view showing an electrostatic chucking device according to one embodiment of the present invention.

FIG. 9 is a cross-sectional view showing the electrostatic chucking device according to the embodiment. In FIG. 9, the same components as those of the above-described ceramic joined body will be represented by the same reference numerals, and the repeated description thereof will not be repeated.

As shown in FIG. 9, an electrostatic chucking device 100 according to the embodiment includes: a disk-shaped electrostatic chuck member 102; a disk-shaped base member 103 for adjusting a temperature that adjusts the electrostatic chuck member 102 to a desired temperature; and an adhesive layer 104 that joins and integrates the electrostatic chuck member 102 and the base member 103 for adjusting a temperature. In the electrostatic chucking device 100 according to the embodiment, the electrostatic chuck member 102 is, for example, the ceramic joined body 1 according to the embodiment. Here, a case where the electrostatic chuck member 102 is the ceramic joined body 1 will be described.

In the following description, a placement surface 111a side of a placement plate 111 is set as "upper side" and the base member 103 side for adjusting a temperature is set as "lower side" to represent relative positions of the components.

[Electrostatic Chuck Member]

The electrostatic chuck member 102 includes: a placement plate 111 that is formed of a ceramic and has, as an upper surface, the placement surface 111a on which a plate-shaped sample such as a semiconductor wafer is placed; a supporting plate 112 that is provided on a surface side of the placement plate 111 opposite to the placement surface 111a; an electrode 113 for electrostatic adsorption that is interposed between the placement plate 111 and the supporting plate 112; an annular insulating material 114 that surrounds the periphery of the electrode 113 for electrostatic adsorption interposed between the placement plate 111 and the supporting plate 112; and a power feeding terminal 116 that is provided in a fixing hole 115 of the base member 103 for adjusting a temperature to be in contact with the electrode 113 for electrostatic adsorption.

In the electrostatic chuck member 102, the placement plate 111 corresponds to the second ceramic plate 43, the supporting plate 112 corresponds to the first ceramic plate 42, the electrode 113 for electrostatic adsorption corresponds to the electrode layer 44, and the insulating material 114 corresponds to the insulating layer 45.

[Placement Plate]

On the placement surface 111a of the placement plate 111, a plurality of protrusions for supporting the plate-shaped sample such as a semiconductor wafer are formed (not shown). Further, in order to prevent leakage of cold gas such as helium (He) in a peripheral portion of the placement surface 111a of the placement plate 111, an annular protrusion having a square shape in cross-section may be provided to surround the peripheral portion. Further, in a region around the annular protrusion on the placement surface 111a, a plurality of protrusions that have the same height as the annular protrusion, have a circular shape in cross-section, and has a substantially rectangular shape in vertical section may be provided.

The thickness of the placement plate 111 is preferably 0.3 mm or more and 3.0 mm or less and more preferably 0.5 mm or more and 1.5 mm or less. When the thickness of the placement plate 111 is 0.3 mm or more, voltage endurance is excellent. On the other hand, when the thickness of the placement plate 111 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Supporting Plate]

The supporting plate 112 supports the placement plate 111 and the electrode 113 for electrostatic adsorption from the lower side.

The thickness of the supporting plate 112 is preferably 0.3 mm or more and 3.0 mm or less and more preferably 0.5 mm or more and 1.5 mm or less. When the thickness of the supporting plate 112 is 0.3 mm or more, a sufficient withstand voltage can be secured. On the other hand, when the thickness of the supporting plate 112 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Electrode for Electrostatic Adsorption]

In the electrode 113 for electrostatic adsorption, by applying a voltage, the electrostatic adsorption force with which the plate-shaped sample is supported on the placement surface 111a of the placement plate 111 is generated.

The thickness of the electrode 113 for electrostatic adsorption is preferably 5 μm or more and 200 μm or less, more preferably 7 μm or more and 100 μm or less, and still more preferably 10 μm or more and 100 μm or less. When the thickness of the electrode 113 for electrostatic adsorption is 5 μm or more, sufficient conductivity can be secured. On the other hand, when the thickness of the electrode 113 for electrostatic adsorption is 200 μm or less, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given desirable temperature. In addition, plasma permeability does not deteriorate, and plasma can be stably generated.

[Insulating Material]

The insulating material 114 is a member that surrounds the electrode 113 for electrostatic adsorption to protect the electrode 113 for electrostatic adsorption from corrosive gas and plasma thereof.

Due to the insulating material 114, the placement plate 111 and the supporting plate 112 are joined and integrated through the electrode 113 for electrostatic adsorption.

[Power Feeding Terminal]

The power feeding terminal 116 is a member that applies a voltage to the electrode 113 for electrostatic adsorption.

The number, the shape, and the like of the power feeding terminals 116 are determined depending on the form of the electrode 113 for electrostatic adsorption, that is, whether the electrode 113 for electrostatic adsorption is unipolar or bipolar.

The material of the power feeding terminal 116 is not particularly limited as long as it is a conductive material having excellent heat resistance. As the material of the power feeding terminal 116, a material having a thermal expansion coefficient similar to those of the electrode 113 for electrostatic adsorption and the supporting plate 112 is preferable. For example, a metal material such as a cobalt alloy or niobium (Nb) and various conductive ceramics are preferably used.

[Conductive Adhesive Layer]

A conductive adhesive layer 117 is provided in the fixing hole 115 of the base member 103 for adjusting a temperature and in a through hole 118 of the supporting plate 112. In addition, the conductive adhesive layer 117 is interposed between the electrode 113 for electrostatic adsorption and the power feeding terminal 116 and electrically connects the electrode 113 for electrostatic adsorption and the power feeding terminal 116 to each other.

A conductive adhesive forming the conductive adhesive layer 117 includes a conductive material such as carbon fibers or metal powder and a resin.

The resin in the conductive adhesive is not particularly limited as long as it suppresses the occurrence of cohesive failure caused by thermal stress. Examples of the resin include a silicone resin, an acrylic resin, an epoxy resin, a phenol resin, a polyurethane resin, and an unsaturated polyester resin.

Among these, a silicone resin is preferable from the viewpoints that the degree of expansion and contraction is high and cohesive failure caused by a change in thermal stress is not likely to occur.

[Base Member for Adjusting Temperature]

The base member 103 for adjusting a temperature is a disk-shaped thick member formed of at least one of a metal or a ceramic. The body of the base member 103 for adjusting a temperature is configured to function as an internal electrode for generating a plasma. In the body of the base member 103 for adjusting a temperature, a flow path 121 for circulating a coolant such as water, He gas, or $N_2$ gas is formed.

The body of the base member 103 for adjusting a temperature is connected to an external high frequency power supply 122. In addition, in the fixing hole 115 of the base member 103 for adjusting a temperature, the power feeding terminal 116 of which the outer periphery is surrounded by an insulating material 123 is fixed through the insulating material 123. The power feeding terminal 116 is connected to an external direct current power supply 124.

A material forming the base member 103 for adjusting a temperature is not particularly limited as long as it is a metal having excellent thermal conductivity, electrical conductivity, and workability or a compound material including the metal. As the material for forming the base member 103 for adjusting a temperature, for example, aluminum (Al), copper (Cu), stainless steel (SUS), or titanium (Ti) is preferably used.

It is preferable that at least a surface of the base member 103 for adjusting a temperature that is exposed to a plasma undergoes an alumite treatment or is coated with a resin such as a polyimide resin. In addition, it is more preferable that the entire surface of the base member 103 for adjusting a temperature undergoes an alumite treatment or is coated with a resin.

The base member 103 for adjusting a temperature undergoes an alumite treatment or is coated with a resin such that plasma resistance of the base member 103 for adjusting a temperature is improved and abnormal discharge is prevented. Accordingly, the plasma resistance stability of the base member 103 for adjusting a temperature can be improved, and surface scratches of the base member 103 for adjusting a temperature can also be prevented.

[Adhesive Layer]

The adhesive layer 104 is configured to bond and integrate the electrostatic chuck member 102 and the base member 103 for adjusting a temperature.

The thickness of the adhesive layer 104 is preferably 100 µm or more and 200 µm or less and more preferably 130 µm or more and 170 µm or less.

When the thickness of the adhesive layer 104 is in the above-described range, the adhesion strength between the electrostatic chuck member 102 and the base member 103 for adjusting a temperature can be sufficiently secured. In addition, the thermal conductivity between the electrostatic chuck member 102 and the base member 103 for adjusting a temperature can be sufficiently secured.

A material of the adhesive layer 104 is formed of, for example, a cured product obtained by thermally curing a silicone resin composition, an acrylic resin, or an epoxy resin.

The silicone resin composition is a silicon compound having a siloxane bond (Si—O—Si) and is a resin having excellent heat resistance and elasticity, which is more preferable.

As the silicone resin composition, in particular, a silicone resin having a thermal curing temperature of 70° C. to 140° C. is preferable.

Here, it is not preferable that the thermal curing temperature is lower than 70° C. because, when the electrostatic chuck member 102 and the base member 103 for adjusting a temperature are joined in a state where they face each other, curing does not progress sufficiently in the process of joining such that the workability deteriorates. On the other hand, it is not preferable that the thermal curing temperature is higher than 140° C. because a difference in thermal expansion between the electrostatic chuck member 102 and the base member 103 for adjusting a temperature is large and stress between the electrostatic chuck member 102 and the base member 103 for adjusting a temperature increases, which may cause peeling therebetween.

That is, it is preferable that the thermal curing temperature is 70° C. or higher because the workability in the process of joining is excellent, and it is preferable that the thermal curing temperature is 140° C. or lower because the electrostatic chuck member 102 and the base member 103 for adjusting a temperature are not likely to peel off from each other.

In the electrostatic chucking device 100 according to the embodiment, the electrostatic chuck member 102 is formed of the ceramic joined body 1. Therefore, in the electrostatic chuck member 102, the occurrence of breakdown (discharge) can be suppressed.

Hereinafter, a method for producing the electrostatic chucking device according to the embodiment will be described.

The electrostatic chuck member 102 formed of the ceramic joined body 1 obtained as described above is prepared.

An adhesive formed of a silicone resin composition is applied to a predetermined region of one main surface 103a of the base member 103 for adjusting a temperature. Here, the amount of the adhesive applied is adjusted such that the electrostatic chuck member 102 and the base member 103 for adjusting a temperature can be joined and integrated.

Examples of a method for applying the adhesive include a method for manually applying the organic adhesive with a spatula, a bar coating method, and a screen printing method.

After applying the adhesive to the main surface 103a of the base member 103 for adjusting a temperature, the electrostatic chuck member 102 and the base member 103 for adjusting a temperature to which the adhesive is applied are laminated.

In addition, the formed power feeding terminal 116 is inserted into the fixing hole 115 that penetrates the base member 103 for adjusting a temperature.

Next, the electrostatic chuck member 102 is pressed against the base member 103 for adjusting a temperature at a predetermined pressure such that the electrostatic chuck member 102 and the base member 103 for adjusting a temperature are joined and integrated. As a result, the electrostatic chuck member 102 and the base member 103 for adjusting a temperature are joined and integrated through the adhesive layer 104.

As a result, the electrostatic chucking device 100 according to the embodiment where the electrostatic chuck member 102 and the base member 103 for adjusting a temperature are joined and integrated through the adhesive layer 104 can be obtained.

The plate-shaped sample according to the embodiment is not limited to a semiconductor wafer and may be, for example, a glass substrate for a flat panel display (FPD) such as a liquid crystal display (LCD), a plasma display (PDP), or an organic EL display. In addition, the electrostatic chucking device according to the embodiment may be designed according to the shape or size of the substrate.

The present invention also includes the following aspects.

[1-1] A ceramic joined body including:
a pair of ceramic plates; and
an electrode layer that is interposed between the pair of ceramic plates,
in which the pair of ceramic plates are formed of an insulating material and a conductive material, respectively,
the electrode layer is formed of a sintered compact of particles of an insulating ceramic and particles of a conductive ceramic and is embedded in at least one of the pair of ceramic plates, and
in an outer edge of the electrode layer, a joint surface between the at least one of the pair of ceramic plates and the electrode layer has an inclination with respect to a thickness direction of the pair of ceramic plates and the electrode layer.

[1-2] The ceramic joined body according to [1-1],
in which materials of the pair of ceramic plates are the same as each other.

[1-3] The ceramic joined body according to [1-2],
in which a relative density of the outer edge of the electrode layer obtained using the following method is lower than a relative density of a center of the electrode layer.

(Method of Measuring Relative Density)

In a cut surface of the ceramic joined body in the thickness direction, a region where the outer edge of the electrode layer overlaps the joint surface in a plan view is imaged at a magnification of 1000-fold to obtain a microscope image. A ratio of the area of a region where the material is present to the area of a portion within an outer contour of the electrode layer in the range is obtained as the relative density of the outer edge of the electrode layer.

In the cut surface, a range having a width of 150 μm that includes a center of the electrode layer is imaged at a magnification of 1000-fold to obtain a microscope image. A ratio of the area of a region where the material is present to the area of a portion within an outer contour of the electrode layer in the range is obtained as the relative density of the center of the electrode layer.

[2-1] A ceramic joined body including:
a pair of ceramic plates;
an electrode layer that is interposed between the pair of ceramic plates; and
an insulating layer that is disposed in a periphery of the electrode layer between the pair of ceramic plates,
in which the pair of ceramic plates are formed of an insulating material and a conductive material, respectively,
the electrode layer is formed of a sintered compact of particles of an insulating ceramic and particles of a conductive ceramic,
in an outer edge of the electrode layer, a joint surface between the electrode layer and the insulating layer has an inclination with respect to a thickness direction of the pair of ceramic plates, the electrode layer, and the insulating layer.

[2-2] The ceramic joined body according to [2-1],
in which materials of the pair of ceramic plates are the same as each other.

[2-3] The ceramic joined body according to [2-2],
in which a relative density of the outer edge of the electrode layer obtained using the following method is lower than a relative density of a center of the electrode layer.

(Method of Measuring Relative Density)

In a cut surface of the ceramic joined body in the thickness direction, a region where the outer edge of the electrode layer overlaps the joint surface in a plan view is imaged at a magnification of 1000-fold to obtain a microscope image. A ratio of the area of a region where the material is present to the area of a portion within an outer contour of the electrode layer in the range is obtained as the relative density of the outer edge of the electrode layer.

In the cut surface, a range having a width of 150 μm that includes a center of the electrode layer is imaged at a magnification of 1000-fold to obtain a microscope image. A ratio of the area of a region where the material is present to the area of a portion within an outer contour of the electrode layer in the range is obtained as the relative density of the center of the electrode layer.

EXAMPLES

Hereinafter, the present invention will be described in detail using Examples and Comparative Examples, but is not limited to the following examples.

Example 1

Mixed powder including 91% by mass of aluminum oxide powder and 9% by mass of silicon carbide powder was molded and sintered. As a result, a ceramic plate (the first ceramic plate, the second ceramic plate) formed of an aluminum oxide-silicon carbide composite sintered compact having a disk shape with a diameter of 450 mm and a thickness of 5.0 mm was prepared.

One surface (joint surface with the second ceramic plate) of the first ceramic plate was ground, and a recess portion having an inclined surface that was inclined with respect to the thickness direction of the first ceramic plate was formed in the one surface of the first ceramic plate. An opening diameter of the formed recess portion decreased in the thickness direction of the first ceramic plate.

Using a screen printing method, a paste for forming an electrode layer was applied to the recess portion of the first ceramic plate where the recess portion was formed to form an electrode layer coating film. The thickness of the electrode layer coating film was adjusted to be 120% the depth at a deepest portion of the recess portion, and the thickness of the electrode layer coating film in the other portions was adjusted by aligning the height position thereof with the surface of the electrode layer coating film at the deepest portion of the recess portion.

When one surface of the first ceramic plate is set as a reference surface and a perpendicular line is drawn from the reference surface to the bottom of the recess portion, "the depth of the recess portion" refers to the distance from the reference surface to the bottom of the recess portion.

As the paste for forming an electrode layer, a dispersion liquid in which aluminum oxide powder and molybdenum carbide powder were dispersed in isopropyl alcohol was used. In the paste for forming an electrode layer, the content of the aluminum oxide powder was 25% by mass, and the content of the molybdenum carbide powder was 25% by mass.

Next, the second ceramic plate was laminated on the one surface of the first ceramic plate such that the surface where the electrode layer coating film was formed faced inward.

Next, a laminate including the first ceramic plate, the electrode layer coating film, the insulating layer coating film, and the second ceramic plate was pressurized in the thickness direction while being heated in an argon atmosphere. The heat treatment temperature was 1700° C., the welding pressure was 10 MPa, and the time for which the heat treatment and the pressurization were performed was 2 hours.

Through the above-described steps, a ceramic joined body according to Example 1 shown in FIG. 4 was obtained.

(Insulating Characteristics Evaluation)

The insulating characteristics of the ceramic joined body were evaluated as described below.

A through electrode was formed in the first ceramic plate. The through electrode was an electrode that penetrated the first ceramic plate in the thickness direction and reached the electrode layer from the surface of the first ceramic plate opposite to the surface in contact with the electrode layer.

In side surface withstand voltage measurement, on a side surface of the ceramic joined body (side surface of the ceramic joined body in the thickness direction), a carbon tape was bonded in a posture in contact with the first ceramic plate, the electrode layer, and the second ceramic plate. A voltage was applied to the ceramic joined body through the carbon tape and the through electrode, and a voltage at which breakdown occurred in the ceramic joined body was measured.

In dielectric layer withstand voltage measurement, a probe was fixed to an upper surface of the second ceramic plate (dielectric layer), a voltage was applied to the ceramic joined body through the probe and the through electrode, and a voltage at which breakdown occurred in the ceramic joined body was measured.

Specifically, in the side surface withstand voltage measurement and the dielectric layer withstand voltage measurement, an RF voltage was applied in a state where a voltage of 3000 V was applied, and this state was maintained for 10 minutes. Next, a voltage of 500 V was gradually applied, and this state was maintained for 10 minutes. When the measured current value exceeded 0.1 mA (milliampere), breakdown occurred. The results are shown in Table 1.
(Junction Ratio of Joint Surface)

"Junction ratio of the joint surface between the first ceramic plate and the electrode layer" was calculated from any scanning electron microscope image of the joint surface. That is, in a freely selected field of view, an electron microscope image at a magnification of 1000-fold was obtained, and the length of an inclined surface in the electron microscope image was set as "total length (L1) of the joint surface". The total length (L1) of the joint surface was measured using the method described in the present specification.

On the other hand, in the electron microscope image, a major axis length of each of voids formed between the first ceramic plate and the electrode layer was obtained, and the sum of the major axis lengths was set as "void length (D1) in the joint surface".

Based on the lengths obtained as described above, a ratio of "the total length (L1) of the joint surface" to "the void length (D1) in the joint surface" was obtained in percentage, and the obtained value was subtracted from 100% to calculate a value as "the junction ratio of the joint surface between the first ceramic plate and the electrode layer".

As a result, in the ceramic joined body according to Example 1, the junction ratio of the joint surface between the first ceramic plate and the electrode layer was 62%.

Comparative Example

A ceramic joined body according to Comparative Example was obtained using the same method as that of Example 1, except that a paste for forming an electrode layer was applied to one surface of the first ceramic plate that was not ground using a screen printing method to form an electrode layer coating film.

The insulating characteristics of the ceramic joined body were evaluated using the same method as that of Example 1. The results are shown in Table 1.
(Junction Ratio of Joint Surface)

When the junction ratio of the joint surface between the first ceramic plate and the electrode layer was calculated using the same method as that of Example 1, the result was 0%.

TABLE 1

| Withstand Voltage | Example 1 | Comparative Example |
| --- | --- | --- |
| Dielectric Layer (kV/mm) | 39.2 | 30.6 |
| Side Surface (kV/mm) | 31.6 | 16.3 |

It was found from the result of Table 1 that the breakdown voltage of the ceramic joined body according to Example 1 was higher than that of the ceramic joined body according to Comparative Example.

Example 2

A ceramic joined body according to Example 2 was obtained using the same method as that of Example 1, except that the thickness of the electrode layer coating film during the preparation of the electrode layer was adjusted to be 80% the depth at the deepest portion of the recess portion.

When the junction ratio of the joint surface between the first ceramic plate and the electrode layer was calculated using the same method as that of Example 1, the result was 44%.
(Density of Electrode Layer)

The density of the electrode layer was obtained using (Method of Measuring Relative Density of Electrode Layer) described above.

Each of the evaluation results is shown in Table 2.

TABLE 2

|  |  | Example 2 |
| --- | --- | --- |
| Density of Outer Edge Portion of Electrode Layer | | 80% |
| Withstand Voltage | Dielectric Layer (kV/mm) | 32.0 |
|  | Side Surface (kV/mm) | 26.0 |

It was verified that the density of the center of the electrode layer was substantially 100%. It was found from the result of Table 2 that, in the ceramic joined body according to Example 2, the relative density of the outer edge of the electrode layer was lower than that of the ceramic joined body according to Example 1, withstand voltage characteristics equivalent to those of Example 1 were exhibited, and the breakdown voltage was higher than that of the ceramic joined body according to Comparative Example.

INDUSTRIAL APPLICABILITY

The ceramic joined body according to the present invention includes: a pair of ceramic plates; and an electrode layer that is interposed between the pair of ceramic plates, in which in an outer edge of the electrode layer, a joint surface between at least one of the pair of ceramic plates and the electrode layer has an inclination with respect to a thickness direction of the pair of ceramic plates and the electrode layer. Therefore, in the ceramic joined body according to the present invention, breakdown (discharge) is suppressed in a joint interface between the ceramic plate and the conductive layer. The ceramic joined body according to the present invention is suitably used for an electrostatic chuck member of an electrostatic chucking device, and the usefulness thereof is significantly high.

REFERENCE SIGNS LIST 1, 10, 20, 30, 40, 50, 60, 70: ceramic joined body
2, 42: ceramic plate (first ceramic plate)
3, 43: ceramic plate (second ceramic plate)
4, 44: electrode layer
5, 46: joint surface
45: insulating layer
100: electrostatic chucking device
102: electrostatic chuck member
103: base member for adjusting a temperature
104: adhesive layer
111: placement plate
112: supporting plate
113: electrode for electrostatic adsorption
114: insulating material
115: fixing hole
116: power feeding terminal
117: conductive adhesive layer 118: through hole
121: flow path
122: high frequency power supply
123: insulating material
124: direct current power supply

The invention claimed is:

1. A ceramic joined body comprising:
a pair of ceramic plates; and
an electrode layer that is interposed between the pair of ceramic plates,
wherein the electrode layer is formed of an insulating ceramic and a conductive ceramic,
wherein the electrode layer is embedded in at least one of the pair of ceramic plates, and
in an outer edge of the electrode layer, a joint surface between the at least one of the pair of ceramic plates and the electrode layer has an inclination with respect to a thickness direction of the pair of ceramic plates and the electrode layer, and
the outer edge of the electrode layer has a relative density which is lower than that of a center of the electrode,
wherein materials of the pair of ceramic plates are the same as each other,
wherein the relative density is a ratio of an area of a region 1 to the total area of an area of the region 1 and an area of a region 2, which is shown in percentage, and
wherein the region 1 is an area where the conductive ceramic and the insulating ceramic are present, and the a region 2 is an area where the conductive ceramic and the insulating ceramic are not present, and wherein the regions are observed in the electrode layer shown in a microscope image of a cut surface of the ceramic joined body which is cut in the thickness direction.

2. The ceramic joined body according to claim 1,
wherein the insulating ceramic is at least one selected from the group consisting of $Al_2O_3$, AlN, $Si_3N_4$, $Y_2O_3$, YAG, $SmAlO_3$, MgO, and $SiO_2$.

3. The ceramic joined body according to claim 1,
wherein the conductive ceramic is at least one selected from the group consisting of SIC, $TiO_2$, TiN, TiC, W, WC, Mo, $Mo_2C$, and C.

4. An electrostatic chucking device,
wherein an electrostatic chuck member formed of a ceramic and a base member for adjusting a temperature formed of a metal are joined through an adhesive layer, and
the electrostatic chuck member is formed of the ceramic joined body according to claim 1.

5. A method for producing the ceramic joined body according to claim 1 comprising:
a step of forming a recess portion on a surface of at least one of a pair of ceramic plates where the pair of ceramic plates overlap each other, the recess portion having an inclined surface that is inclined with respect to a thickness direction of the pair of ceramic plates;
a step of applying a paste for forming an electrode layer to the recess portion to form an electrode layer coating film;
a step of laminating the pair of ceramic plates in a posture in which the surface where the electrode layer coating film is formed faces inward to form a laminate; and
a step of pressurizing the laminate including the pair of ceramic plates and the electrode layer coating film in the thickness direction while heating the laminate.

6. The ceramic joined body according to claim 1,
wherein one of the ceramic plates has a surface as a placement surface on which a plate-shaped sample is placed,
the electrode layer has two surfaces which face each other and are perpendicular to the thickness direction of the ceramic plates, and
one of the two surfaces, which is closer to the placement surface than the other of the two surfaces, has a larger width than that of the other of the two surfaces.

7. The ceramic joined body according to claim 1,
wherein one of the ceramic plates has a surface as a placement surface on which a plate-shaped sample is placed,
the electrode layer has two surfaces which face each other and are perpendicular to the thickness direction of the ceramic plates, and
one of the two surfaces, which is closer to the placement surface than the other of the two surfaces, has a smaller width than that of the other of the two surfaces.

8. The ceramic joined body according to claim 1,
wherein the electrode layers are respectively embedded in the pair of ceramic plates,
a lower surface of one of the embedded electrode layers is in contact with an upper surface of the other electrode layer, and
on an outer edge of the electrode layers, a lower end of the joint surface of the electrode layer is in contact with an upper end of that of the other electrode layer.

9. A ceramic joined body comprising:
a pair of ceramic plates;
an electrode layer that is interposed between the pair of ceramic plates; and
an insulating layer that is disposed in a periphery of the electrode layer between the pair of ceramic plates,
wherein the electrode layer is formed of an insulating ceramic and a conductive ceramic,
wherein in an outer edge of the electrode layer, a joint surface between the electrode layer and the insulating layer has an inclination with respect to a thickness direction of the pair of ceramic plates, the electrode layer, and the insulating layer, and
the outer edge of the electrode layer has a relative density which is lower than that of a center of the electrode layer,
wherein materials of the pair of ceramic plates are the same as each other,
wherein the relative density is a ratio of an area of a region 1 to the total area of an area of the region 1 and an area of a region 2, which is shown in percentage, and
wherein the region 1 is an area where the conductive ceramic and the insulating ceramic are present, and the a region 2 is an area where the conductive ceramic and the insulating ceramic are not present, wherein the regions are observed in the electrode layer shown in a microscope image of a cut surface of the ceramic joined body which is cut in the thickness direction.

10. A method for producing the ceramic joined body according to claim 9 comprising:
a step of applying a paste for forming an electrode layer to a surface of at least of a pair of ceramic plates where the pair of ceramic plates overlap each other to form an electrode layer coating film and applying a paste for forming an insulating layer to a periphery of the electrode layer coating film to form an insulating layer coating film;
a step of laminating the pair of ceramic plates in a posture in which the surface where the electrode layer coating film and the insulating layer coating film are formed faces inward to form a laminate; and a step of pressurizing the laminate including the pair of ceramic plates, the electrode layer coating film, and the insulating layer coating film in a thickness direction while heating the laminate, wherein in the step of forming the insulating layer coating film, an outer edge of the electrode layer coating film and an inner edge of the insulating layer coating film overlap each other, and a contact surface between the electrode layer coating film and the insulating layer coating film has an inclination with respect to the thickness direction of the pair of ceramic plates.

11. The ceramic joined body according to claim 9, wherein the insulating ceramic is at least one selected from the group consisting of $Al_2O_3$, AlN, $Si_3N_4$, $Y_2O_3$, YAG, $SmAlO_3$, MgO, and $SiO_2$.

12. The ceramic joined body according to claim 9, wherein the conductive ceramic is at least one selected from the group consisting of SiC, $TiO_2$, TiN, TiC, W, WC, Mo, $Mo_2C$, and C.

13. An electrostatic chucking device, wherein an electrostatic chuck member formed of a ceramic and a base member for adjusting a temperature formed of a metal are joined through an adhesive layer, and the electrostatic chuck member is formed of the ceramic joined body according to claim 9.

14. The ceramic joined body according to claim 9, wherein one of the ceramic plates has a surface as a placement surface on which a plate-shaped sample is placed, the electrode layer has two surfaces which face each other and are perpendicular to the thickness direction of the ceramic plates, and one of the two surfaces, which is closer to the placement surface than the other of the two surfaces, has a larger width than that of the other of the two surfaces.

15. The ceramic joined body according to claim 9, wherein one of the ceramic plates has a surface as a placement surface on which a plate-shaped sample is placed, the electrode layer has two surfaces which face each other and are perpendicular to the thickness direction of the ceramic plates, and one of the two surfaces, which is closer to the placement surface than the other of the two surfaces, has a smaller width than that of the other of the two surfaces.

16. The ceramic joined body according to claim 9, further comprising:

an electrode layer which is embedded in at least one of the pair of ceramic plates, wherein in an outer edge of the embedded electrode layer, a joint surface between the at least one of the pair of ceramic plates and the embedded electrode layer has an inclination with respect to a thickness direction of the pair of ceramic plates and the electrode layer, wherein a surface of the embedded electrode layer contacts with a surface of the electrode layer which is surrounded by the insulating layer, and an end of the joint surface of the embedded electrode layer contacts with an end of the joint surface of the electrode layer which is surrounded by the insulating layer.

* * * * *